(12) United States Patent
Lu

(10) Patent No.: US 11,538,760 B2
(45) Date of Patent: Dec. 27, 2022

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 17/125,848

(22) Filed: Dec. 17, 2020

(65) Prior Publication Data
US 2022/0199538 A1 Jun. 23, 2022

(51) Int. Cl.
*H01L 23/538* (2006.01)
*H01L 21/48* (2006.01)
*H01L 23/498* (2006.01)
*H01L 25/065* (2006.01)

(52) U.S. Cl.
CPC ...... *H01L 23/5383* (2013.01); *H01L 21/4857* (2013.01); *H01L 23/49822* (2013.01); *H01L 25/0655* (2013.01)

(58) Field of Classification Search
CPC ..... H01L 23/538–5381; H01L 23/5383; H01L 23/5385; H01L 23/5386; H01L 21/4857; H01L 23/49822
See application file for complete search history.

(56) References Cited

U.S. PATENT DOCUMENTS

| 2018/0053723 | A1* | 2/2018 | Hu | H01L 21/486 |
| 2018/0204807 | A1 | 7/2018 | Aizawa | |
| 2018/0294212 | A1* | 10/2018 | Chen | H01L 21/481 |
| 2019/0103386 | A1 | 4/2019 | Chen et al. | |
| 2020/0168550 | A1* | 5/2020 | Ryu | H01L 24/19 |
| 2020/0343212 | A1* | 10/2020 | Huang | H01L 21/76816 |

\* cited by examiner

*Primary Examiner* — Selim U Ahmed
*Assistant Examiner* — Evan G Clinton
(74) *Attorney, Agent, or Firm* — Foley & Lardner LLP

(57) ABSTRACT

A semiconductor package structure and a method for manufacturing a semiconductor package structure are provided. The semiconductor package structure includes a lower conductive structure, a first semiconductor device and a second semiconductor device. The upper conductive structure is disposed on the lower conductive structure. The second semiconductor device is electrically connected to the first semiconductor device by a first path in the upper conductive structure. The lower conductive structure is electrically connected to the first semiconductor device through a second path in the upper conductive structure under the first path.

16 Claims, 25 Drawing Sheets

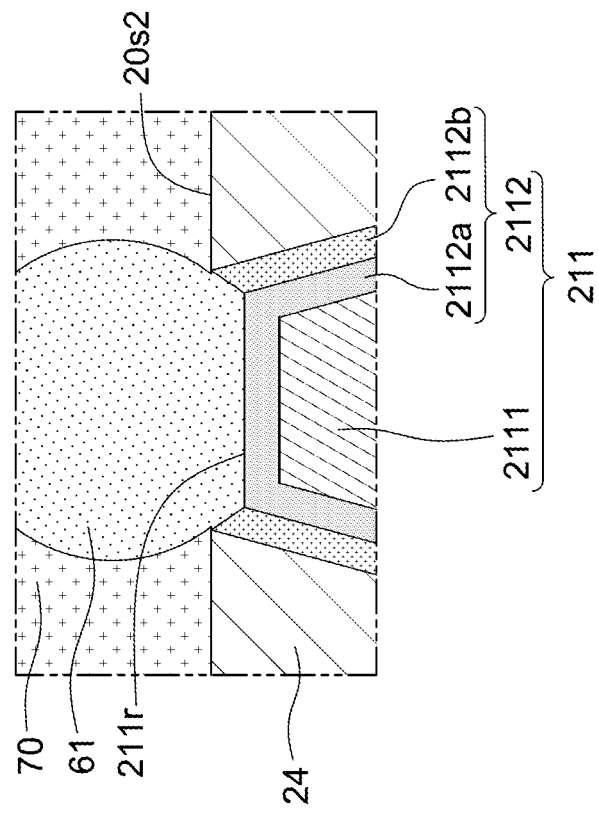
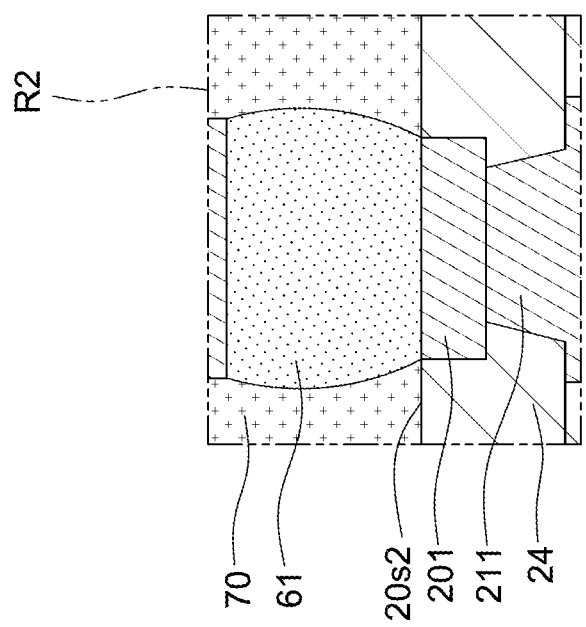
FIG. 3B
FIG. 3A

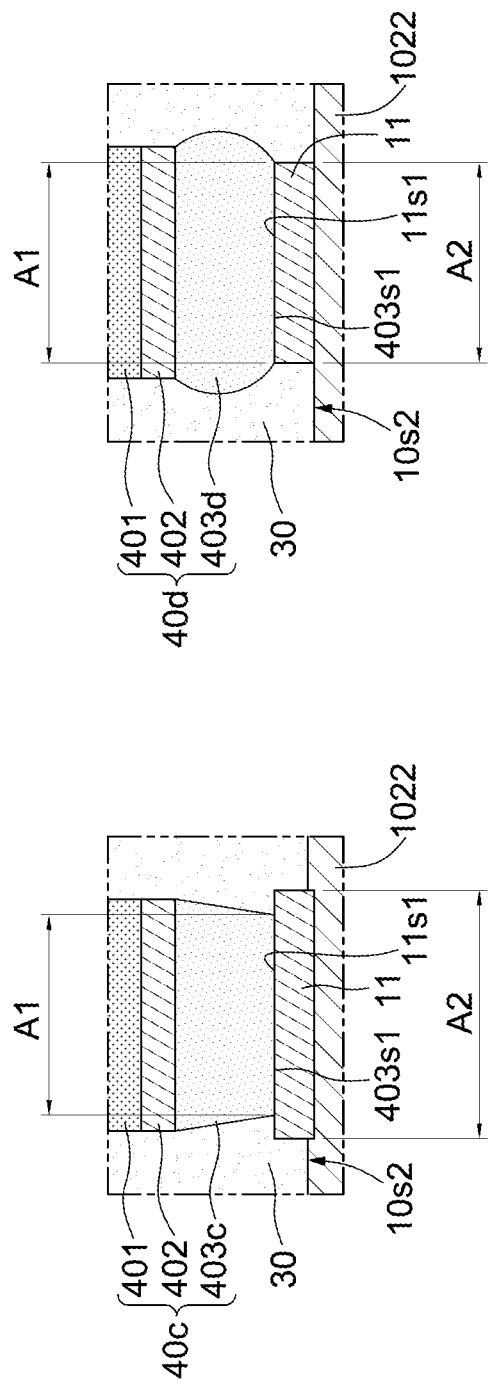

SEMICONDUCTOR PACKAGE STRUCTURE AND METHOD FOR MANUFACTURING THE SAME

BACKGROUND

1. Field of the Disclosure

The present disclosure relates to a semiconductor package structure and a method, and to a semiconductor package structure including two semiconductor devices.

2. Description of the Related Art

In a conventional semiconductor package structure, tall pillars are formed on a redistribution layer, and then a bridge die is attached to the redistribution layer through a bonding process. However, the bridge die may collide with the tall pillar such that the tall pillar may be damaged. As a result, the yield of the bonding process may decrease. Therefore, a new semiconductor package structure is required.

SUMMARY

In some embodiments, a semiconductor package structure includes a lower conductive structure, a first semiconductor device and a second semiconductor device. The upper conductive structure is disposed on the lower conductive structure. The second semiconductor device is electrically connected to the first semiconductor device by a first path in the upper conductive structure. The lower conductive structure is electrically connected to the first semiconductor device through a second path in the upper conductive structure under the first path In some embodiments, a method of manufacturing a semiconductor package structure includes: (a) providing a lower conductive structure; (b) providing an upper conductive structure; (c) bonding the upper conductive structure to the lower conductive structure; and (d) forming at least one conductive via extending through the upper conductive structure such that the at least one conductive via is electrically connected to the lower conductive structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 3A is a partial enlarged view of the semiconductor package structure of FIG. 1.

FIG. 3B illustrates a cross-sectional view of an example of a semiconductor package structure according to some embodiments of the present disclosure.

FIG. 6 is a cross-sectional view of an example of a conductive structure according to some embodiments of the present disclosure.

FIG. 7 is a cross-sectional view of an example of a conductive structure according to some embodiments of the present disclosure.

DETAILED DESCRIPTION

Figure 1A:
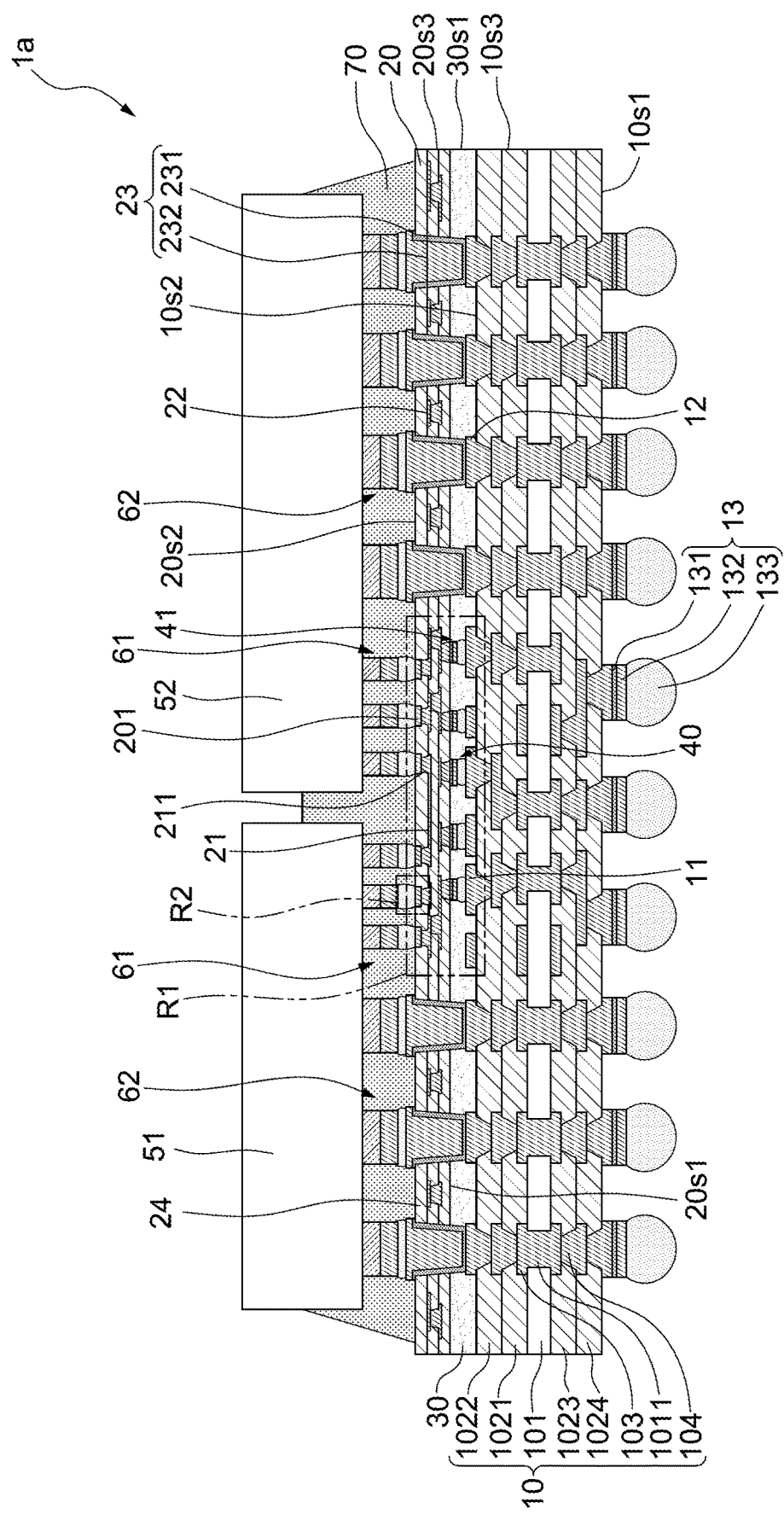
FIG. 1A illustrates a cross-sectional view of an example of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A illustrates a cross-sectional view of an example of a semiconductor package structure 1a according to some embodiments of the present disclosure.

The semiconductor package structure 1a may include a lower conductive structure 10, a plurality of connecting structures 13, an upper conductive structure 20, a bonding layer 30, an interconnection structure 40, a first semiconductor device 51, a second semiconductor device 52 and an underfill 70.

The lower conductive structure 10 may have a first surface 10s1, a second surface 10s2 opposite to the first surface 10s1 and a side surface 10s3 extending between the first surface 10s1 and the second surface 10s2. The first surface 10s1 may also be referred to as a lower surface or a bottom surface of the lower conductive structure 10. The second surface 10s2 may also be referred to as an upper surface or a top surface of the lower conductive structure 10.

The lower conductive structure 10 may include a core portion 101, a plurality of dielectric layers 1021, 1022, 1023 and 1024, a plurality of circuit layers 103, a plurality of interconnection vias 104, a plurality of first pads 11 and a plurality of second pads 12. The core portion 101 may be disposed between the dielectric layers 1021 and 1023. The core portion 101 may include a plurality of through vias 1011 extending through the core portion 101 for vertical connection. The dielectric layers 1021, 1022, 1023 and 1024 may be disposed on the core portion 101. For example, the dielectric layers 1021 and 1022 may be disposed on an upper surface of the core portion 101, and the dielectric layers 1023 and 1024 may be disposed on a lower surface of the core portion 101. The upper surface of the dielectric layer 1022 may be defines as the second surface 10s2 of the lower conductive structure 10, and the lower surface of the dielectric layer 1024 may be defines as the first surface 10s1 of the lower conductive structure 10. In some embodiments, the dielectric layers 1021, 1022, 1023 and 1024 may include a benzocyclobutene (BCB) based polymer or a polyimide (PI). The circuit layer 103 may be in contact with or embedded in the dielectric layers 1021, 1022, 1023 and 1024. The circuit layer 103 may be electrically connected to the interconnection vias 104. In some embodiments, the circuit layer 103 and the interconnection vias 104 may be formed concurrently and integrally. In some embodiments, some of the interconnection vias 104 may electrically connect the second pad 12, the conductive via 23 and the connecting structure 13 for grounding or powering, or for transmitting signals.

The first pads 11 and the second pads 12 may be disposed on the second surface 10s2 of the lower conductive structure 10 (e.g., the upper surface of the topmost dielectric layer 1022 of the lower conductive structure 10). The first pads 11 may be surrounded by the second pads 12. In some embodiments, the pitch of the first pads 11 may be different from the pitch of the second pads 12. In some embodiments, the pitch of the first pads 11 may be less than the pitch of the second pads 12. The circuit layer 103 may be electrically connected to the first pads 11 and the second pads 12 through the interconnection vias 104.

The connecting structures 13 may be disposed on the first surface 10s1 of the lower conductive structure 10 for external connection. Each of the connecting structures 13 may include a seed layer 131, a conductive layer 132 and a connecting element 133. The seed layer 131 may be in contact with the bottommost circuit layer 103 of the lower conductive structure 10, and the conductive layer 132 may be formed or disposed on the seed layer 131. The connecting element 133 may be formed or disposed on the conductive layer 132. The connecting element 133 may include, for example, solder balls, solder bumps or other conductive bumps. The connecting structure 13 may be electrically connected to the first pad 11 through the circuit layer(s) 103, the interconnection via(s) 104 and the through via 1011 of the lower conductive structure 10. The connecting structures 13 may be electrically connected to the second pads 12 through the circuit layers(s) 103, the interconnection via(s) 104 and the through via 1011 of the lower conductive structure 10.

The bonding layer 30 may be disposed on the second surface 10s2 of the lower conductive structure 10. The bonding layer 30 may be disposed between the lower conductive structure 10 and the upper conductive structure 20. The bonding layer 30 may be configured to, for example, attach the upper conductive structure 20 to the lower conductive structure 10. The first pads 11 and the second pads 12 may be covered by the bonding layer 30. The bonding layer 30 may be an adhesion layer that is cured from an adhesive material (e.g., includes a cured adhesive material such as an adhesive polymeric material). In some embodiments, the bonding layer 30 may include a non-conductive paste (NCP), a non-conductive film (NCF), a capillary underfill (CUF) or other suitable materials. In some embodiments, a side surface $30s1$ of the bonding layer 30 may be substantially coplanar with the side surface $10s3$ of the lower conductive structure 10.

In some embodiments, the interconnection structure 40 may be disposed in the bonding layer 30. In some embodiments, the interconnection structure 40 may be embedded in the bonding layer 30. The interconnection structure 40 may be configured to electrically connect the lower conductive structure 10 and the upper conductive structure 20. The interconnection structure 40 may be disposed on or in contact with the first pads 11. The interconnection structure 40 may be electrically connected to the first pads 11. In some embodiments, the high-density circuit 21 of the upper conductive structure 20 may be electrically connected to the lower conductive structure 10 through the interconnection structure 40. The interconnection structure 40 may have different profiles based on the material of the bonding layer 30, which will be described later. In other embodiments, there is no interconnection structure 40 in the bonding layer 30 such that the high-density circuit 21 of the upper conductive structure 20 may be electrically isolated from the lower conductive structure 10.

The upper conductive structure 20 may be disposed on the bonding layer 30. The upper conductive structure 20 may have a first surface $20s1$, a second surface $20s2$ opposite to the first surface $20s1$ and a side surface $20s3$ extending between the first surface $20s1$ and the second surface $20s2$. The first surface $20s1$ of the upper conductive structure 20 may face the second surface $10s2$ of the lower conductive structure 10. The second surface $20s2$ of the upper conductive structure 20 may face away from the lower conductive structure 10. The interconnection structure 40 may be disposed on the first surface $20s1$ of the upper conductive structure 20. Further, the interconnection structure 40 may have a pad 41 disposed on the first surface $20s1$ of the upper conductive structure 20. The first surface $20s1$ may also be referred to as a lower surface or a bottom surface of the upper conductive structure 20. The second surface $20s2$ may also be referred to as an upper surface or a top surface of the upper conductive structure 20. In some embodiments, the side surface $20s3$ of the upper conductive structure 20 may be substantially coplanar with the side surface $10s3$ of the lower conductive structure 10 and/or the side surface $30s1$ of the bonding layer 30.

The upper conductive structure 20 may include a high-density circuit 21, a low-density circuit 22, at least one conductive via 23 and a plurality of dielectric layers 24. The high-density circuit 21 may be disposed in a high-density region of the upper conductive structure 20, and the low-density circuit 22 may be disposed in a low-density region of the upper conductive structure 20. The high-density circuit 21 may be surrounded by the low-density circuit 22. In some embodiments, the high-density circuit 21 may extend laterally from a position under the first semiconductor device 51 to a position under the second semiconductor device 52. Thus, the second semiconductor device 52 may be electrically connected to the first semiconductor device 51 through the high-density circuit 21 of the upper conductive structure 20 by a first path. In some embodiments, the high-density circuit 21 may vertically overlap or correspond to the first pads 11 of the lower conductive structure 10. In some embodiments, the high-density circuit 21 may vertically overlap or correspond to the connecting structure 40. That is, a projection of the interconnection structure 40 on the lower conductive structure 10 may overlap a projection of the high-density circuit 21 on the lower conductive structure 10. The first pads 11 of the lower conductive structure 10 may be disposed under the high-density circuit 21 of the upper conductive structure 20. In some embodiments, the high-density circuit 21 of the upper conductive structure 20 may be electrically connected to the lower conductive structure 10 through flip-chip bonding. In some embodiments, the high-density circuit 21 may be electrically connected to the lower conductive structure 10 through the interconnection structure 40. In some embodiments, the high-density circuit 21 may be disposed between a projection of the first semiconductor device 51 and a projection of the second semiconductor device 52, and may be used for transmitting signals between the first semiconductor device 51 and the second semiconductor device 52. For example, a pad 201 (or the topmost circuit layer) of the high-density circuit 21 is used for transmitting signals between the first semiconductor device 51 and the second semiconductor device 52. In addition, the low-density circuit 22 may be vertically free from overlapping the first pads 11. In some embodiments, the low-density circuit 22 may be electrically connected to the lower conductive structure 10 through the conductive via 23.

In some embodiments, the high-density circuit 21 may include a plurality of vias 211. The vias 211 may be embedded in the dielectric layer 24 for electrically connecting different circuit layers. In some embodiments, the via 211 may be tapered upwardly along a direction from the first surface $20s1$ toward the second surface $20s2$ of the upper conductive structure 20.

In some embodiments, a density of a circuit line (including, for example, a trace or a pad) of the high-density circuit 21 is greater than a density of a circuit line of the low-density circuit 22. That is, the count of the circuit line (including, for example, a trace or a pad) in a unit area of the high-density circuit 21 is greater than the count of the circuit line in an equal unit area of the low-density circuit 22, such as about 1.2 times or greater, about 1.5 times or greater, or about 2 times or greater. Alternatively, or in combination, a line width/line space (L/S) of the high-density circuit 21 is less than a L/S of the low-density circuit 22, such as about 90% or less, about 50% or less, or about 20% or less. For example, the line width/line space (L/S) of the high-density circuit 21 may be less than or equal to about 10 μm/about 10 μm, about 7 μm/about 7 μm, about 5 μm/about 5 μm, about 2 μm/about 2 μm, or less than or equal to about 1.8 μm/about 1.8 μm. The L/S of the low-density circuit 22 may be greater than or equal to about 10 μm/about 10 μm, or greater than or equal to about 12 μm/about 12 μm.

The conductive via(s) 23 may be disposed on the second pads 12 of the lower conductive structure 10. The conductive via(s) 23 may be vertically aligned and correspond to the second pads 12 of the lower conductive structure 10. The conductive via(s) 23 may be electrically connected to the second pads 12 of the lower conductive structure 10. Thus, the conductive via(s) 23 may be electrically connected to the lower conductive structure 10 through the second pads 12.

In some embodiments, the conductive via(s) 23 may contact the second pads 12 of the lower conductive structure 10 directly. The conductive via(s) 23 may extend through the upper conductive structure 20. In some embodiments, the conductive via(s) 23 may extend through a portion of the bonding layer 30. The high-density circuit 21 may be surrounded by the conductive via(s) 23. The conductive via(s) 23 may be disposed in the low-density region of the upper conductive structure 20.

The conductive via 23 may include a seed layer 231 and a conductive material 232. The conductive material 232 may be surrounded by the seed layer 231. A portion of the seed layer 231 may be disposed between the lower conductive structure 10 and the conductive material 232. An upper surface of the conductive material 232 may be regarded as the upper surface of the conductive via 23. In some embodiments, the upper surface of the conductive via 23 is not coplanar with the upper surface of the pad 201 of the upper conductive structure 20. In some embodiments, the upper surface of the conductive via 23 is higher than the upper surface of the pad 201 of the upper conductive structure 20. The bottommost surface of the seed layer 231 may be regarded as the lower surface of the conductive via 23. In some embodiments, the lower surface of the conductive via 23 is not coplanar with the lower surface of the pad 41 of the interconnection structure 40. In some embodiments, the lower surface of the conductive via 23 is lower than the lower surface of the pad 41 of the interconnection structure 40.

The pitch of the conductive via(s) 23 may be different from the line pitch (or line space) of the high-density circuit 21. The pitch of the conductive via(s) 23 may be equal to or similar to the line pitch (or line space) of the low-density circuit 22. The conductive via(s) 23 may be regarded as a part of the low-density circuit 22. In some embodiments, the conductive via(s) 23 may be electrically isolated from the low-density circuit 22. In some embodiments, the conductive via(s) 23 may be tapered downwardly along a direction from the second surface 20s2 toward the first surface 20s1 of the upper conductive structure 20. Thus, a tapering direction of the conductive via 23 may be different from a tapering direction of the via 211 of the upper conductive structure 20. In other embodiments, the conductive via(s) 23 may be electrically connected to the low-density circuit 22. The conductive via 23 may be electrically connected to the second pad 12 and the interconnection via 104 of the lower conductive structure 10 for grounding or powering or for transmitting signals. In some embodiments, both the conductive via 23 and the interconnection structure 40 can electrically connect the lower conductive structure 10 and first semiconductor device 51 as well as the second semiconductor device 52, the profile and structure of the conductive via 23 are different from the profile and structure of the interconnection structure 40. As shown in FIG. 1A, the lower conductive structure 10 is electrically connected to the first semiconductor device 51 or the second semiconductor device 52 through the interconnection structure 40. In some embodiments, the high-density circuit 21 may be electrically connected to the lower conductive structure 10 by a first electrical conductive path through the interconnection structure 40 and by a second electrical conductive path through the first connecting structure 61, the first semiconductor device 51 or the second semiconductor device 52, the second connecting structure 62 and the conductive via 23. In this embodiment, the first electrical conductive path is shorter than the second electrical conductive path.

The first semiconductor device 51 and/or the second semiconductor device 52 may be attached to and disposed on the second surface 20s2 of the upper conductive structure 20. The first semiconductor device 51 and/or the second semiconductor device 52 may be electrically connected to the upper conductive structure 20. The first semiconductor device 51 may be, for example, an application specific integrated circuit (ASIC). The second semiconductor device 52 may be, for example, a high bandwidth memory (HBM). In some embodiments, the first semiconductor device 51 may be electrically connected to the second semiconductor device 52 through a first path. For example, the first semiconductor device 51 may be electrically connected to the second semiconductor device 52 through the high-density circuit 21 of the upper conductive structure 20, which extends laterally from under the first semiconductor device 51 to under the second semiconductor device 51. In some embodiments, the lower conductive structure 10 may be electrically connected to the first semiconductor device 51 or the second semiconductor device 52 through a second path under the first path. For example, the lower conductive structure 10 may be electrically connected to the first semiconductor device 51 or the second semiconductor device 52 through the interconnection structure 40 that is under the high-density circuit 21. The first semiconductor device 51 is electrically connected to receive power or is grounded through the second path.

Although FIG. 1A illustrates that the semiconductor package structure 1a includes two semiconductor devices (e.g., the first semiconductor device 51 and the second semiconductor device 52), three or more semiconductor devices can be included in the semiconductor package structure 1a. In other embodiments, the semiconductor package structure 1a may include a third semiconductor device (not shown), the third semiconductor device may be disposed on the second surface 20s2 of the upper conductive structure 20 and electrically connected to the first semiconductor device 51 and/or the second semiconductor device 52 by an additional high-density circuit 21.

Each of the first semiconductor device 51 and the second semiconductor device 52 may include a plurality of first connecting structures 61 (e.g., solder bumps or other conductive bumps) and a plurality of second connecting structures 62 (e.g., solder bumps or other conductive bumps). Each of the first connecting structures 61 and the second connecting structures 62 may include multiple layers, for example, a titanium layer, a copper layer, a AgSn layer, a Sn layer, and other suitable conductive layers. The pitch and/or size of the first connecting structures 61 may be less than that of the second connecting structures 62. The first connecting structures 61 may be electrically connected to the high-density circuit 21 of the upper conductive structure 20. The second connecting structures 62 may be electrically connected to the conductive via(s) 23. The first semiconductor device 51 may be electrically connected to the second semiconductor device 52 through the first connecting structures 61 and the high-density circuit 21. The first semiconductor device 51 and/or the second semiconductor device 52 may be electrically connected to the lower conductive structure 10 through the second connecting structures 62 and the conductive via(s) 23.

The underfill 70 may be disposed in a space between the first semiconductor device 51 and the second surface 20s2 of the upper conductive structure 20, and in a space between the second semiconductor device 52 and the second surface 20s2 of the upper conductive structure 20. The underfill 70 may be configured to cover and protect the first connecting structures 61 and second connecting structures 62. In other embodiments, the underfill 70 may be replaced by a mold underfill (MUF), which may encapsulate the first semiconductor device 51 and the second semiconductor device 52.

In a comparative example, a bridge die is used to electrically connect the ASIC and the HBM, and tall pillars are disposed on the substrate. The tall pillars may be configured to electrically connect the ASIC and the substrate as well as the HBM and the substrate. In a manufacturing process, the tall pillars are formed or disposed on the substrate, then, the bridge die is bonded to a region of the substrate that is surrounded by the tall pillars. However, during attaching the bridge die to the substrate, the bridge die may collide with the tall pillars such that the tall pillars may be damaged, causing a low yield. Further, since only a portion (e.g., top portion) of the bridge die may be used to form the electrical path to connect the HBM and the ASIC, the bridge die may cause a greater size of the semiconductor package structure and a less I/Os. As compared with the conventional semiconductor package structure, the bridge die and the tall pillars are omitted and replaced by the high-density circuit 21, the low-density circuit 22 and the conductive via(s) 23. The high-density circuit 21, the low-density circuit 22 and the conductive via(s) 23 may be integrated in the upper conductive structure 20, which may benefit in reducing the size of the overall structure. Further, the first semiconductor device 51 and/or the second semiconductor device 52 may be electrically connected to the lower conductive structure 10 through the high-density circuit 21 and the interconnection structure 40, achieving a 3D communication.

Figure 1B:
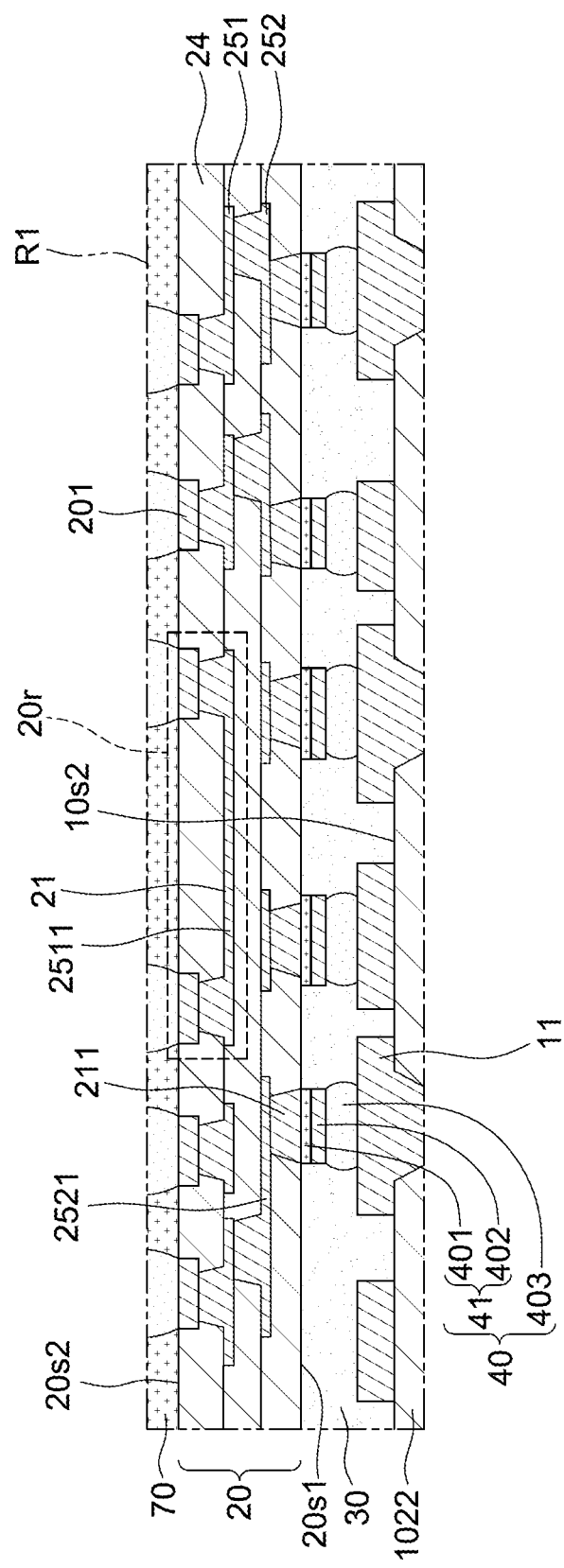
FIG. 1B is a partial enlarged view of the semiconductor package structure of FIG. 1A.

FIG. 1B is a partial enlarged view of the region R1 of the semiconductor package structure 1a of FIG. 1A. As shown in FIG. 1B, the upper conductive structure 20 may have a bridge region 20r. The bridge region 20r may be configured to electrically connect the first semiconductor device 51 and the second semiconductor device 52. As shown in FIG. 1B, the high-density circuit 21 may include a first conductive layer 251 and a second conductive layer 252. The second conductive layer 252 and the first conductive layer 251 may be located in different dielectric layers 24. The first conductive layer 251 may have a plurality of first traces 2511. The first path may include a plurality of first traces 2511. The first trace 2511 may electrically connect the first semiconductor device 51 and the second semiconductor device 52, and extend across a gap between the first semiconductor device 51 and the second semiconductor device 52. The bridge region 20r may be defined as or composed of a region enclosed by an outmost conductive layer of the first trace 2511 from a top view (not shown). In some embodiments, the first semiconductor device 51 is electrically connected to the second semiconductor device 52 through the first trace 2511 of the bridge region 20r by the first path. That is, the first trace 2511 may serve as the first path. The second conductive layer 252 may have a second trace 2521. The second trace 2521 may be located under the bridge region 20r. The second trace 2521 may be located under the first trace 2511. The second trace 2521 may be configured to electrically connect the first semiconductor device 51 to the lower conductive structure 10. That is, the second trace 2521 may serve as the second path. In some embodiments, a projection of the second trace 2521 on the lower conductive structure 10 exceeds an edge of a projection of the first trace 2511 on the lower conductive structure 10. In some embodiments, a projection of the second trace 2521 on the lower conductive structure 10 exceeds an edge of a projection of the bridge region 20r on the lower conductive structure 10. In some embodiments, an area of the projection of the second trace 2521 on the lower conductive structure 10 is greater than an area of the projection of the first trace 2511 on the lower conductive structure 10. In some embodiments, the second path is located under the bridge region 20r.

In some embodiments, the interconnection structure 40 may include a seed layer 401, a conductive layer 402 and an interconnect element 403. The seed layer 401 and the conductive layer 402 may be collectively regarded as the pad 41 of the interconnection structure 40. That is, the pad 41 of the interconnection structure 40 may be disposed on the first surface 20s1 of the upper conductive structure 20. The seed layer 401, the conductive layer 402 and the interconnect element 403 may be embedded in the bonding layer 30. The seed layer 401 may be disposed adjacent to the first surface 20s1 of the upper conductive structure 20. In some embodiments, the seed layer 401 may be in contact with the via 211 of the upper conductive structure 20. The seed layer 401 may include, for example, titanium (Ti), tantalum (Ta) or titanium tungsten (TiW).

The conductive layer 402 may be disposed between the seed layer 401 and the interconnect element 403. The conductive layer 402 may include a metal, a metal alloy, or other conductive material. For example, the conductive layer 402 may be formed of copper.

The interconnect element 403 may be disposed adjacent to the second surface 10s2 of the lower conductive structure 10. The interconnect element 403 may be in contact with the first pad 11. The interconnect element 403 may include, for example, a solder layer.

Figure 2A:
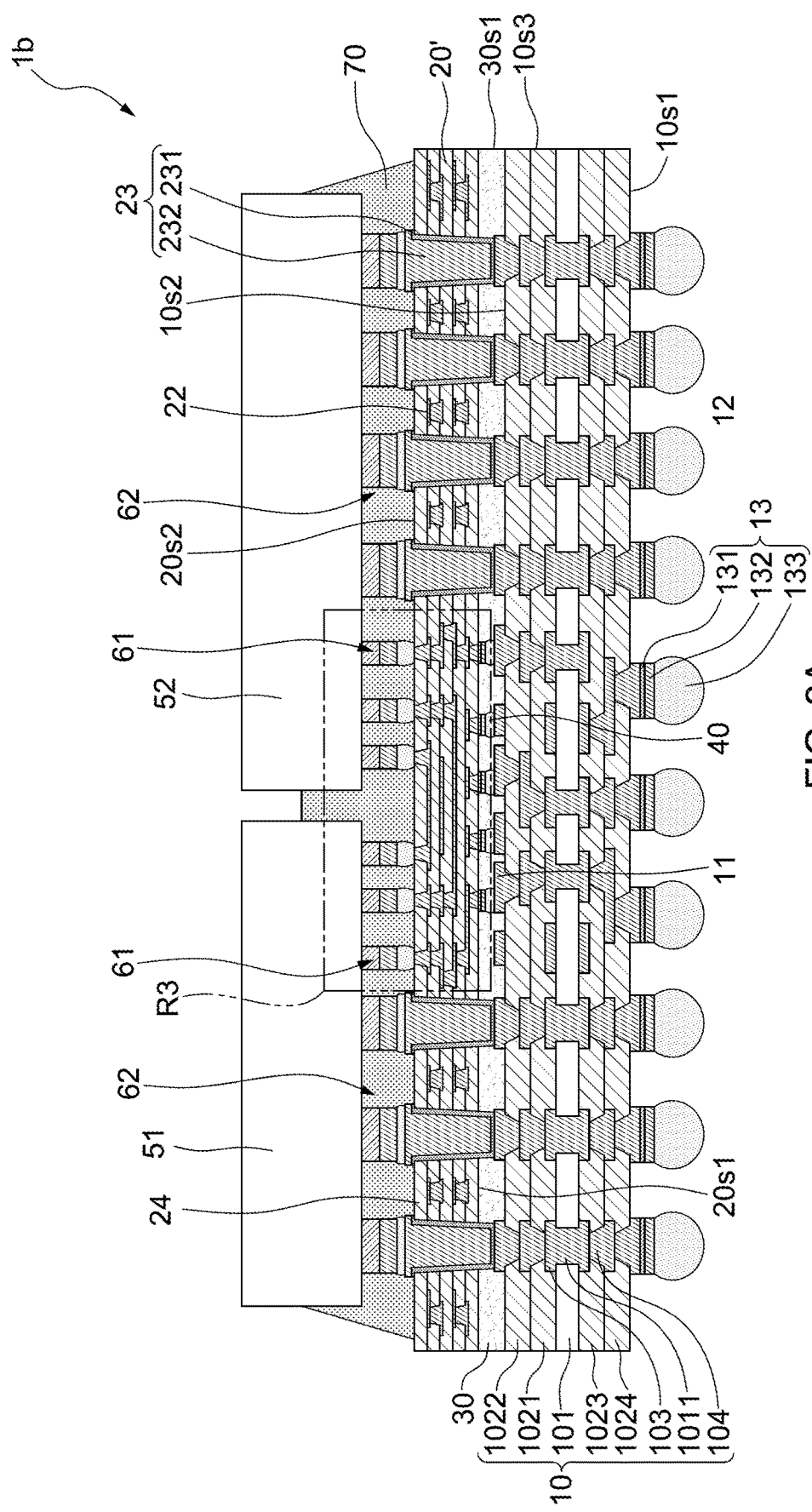
FIG. 2A illustrates a cross-sectional view of an example of a semiconductor package structure according to some embodiments of the present disclosure.

FIG. 2A illustrates a cross-sectional view of an example of a semiconductor package structure 1b according to some embodiments of the present disclosure. The structure of the semiconductor package structure 1b may be similar to that of the semiconductor package structure 1a of FIG. 1A except for the upper conductive structure 20' of the semiconductor package structure 1b. As shown in FIG. 2A, the upper conductive structure 20' may have more dielectric layers 24 and more conductive layers than the upper conductive structure 20 has.

Figure 2B:
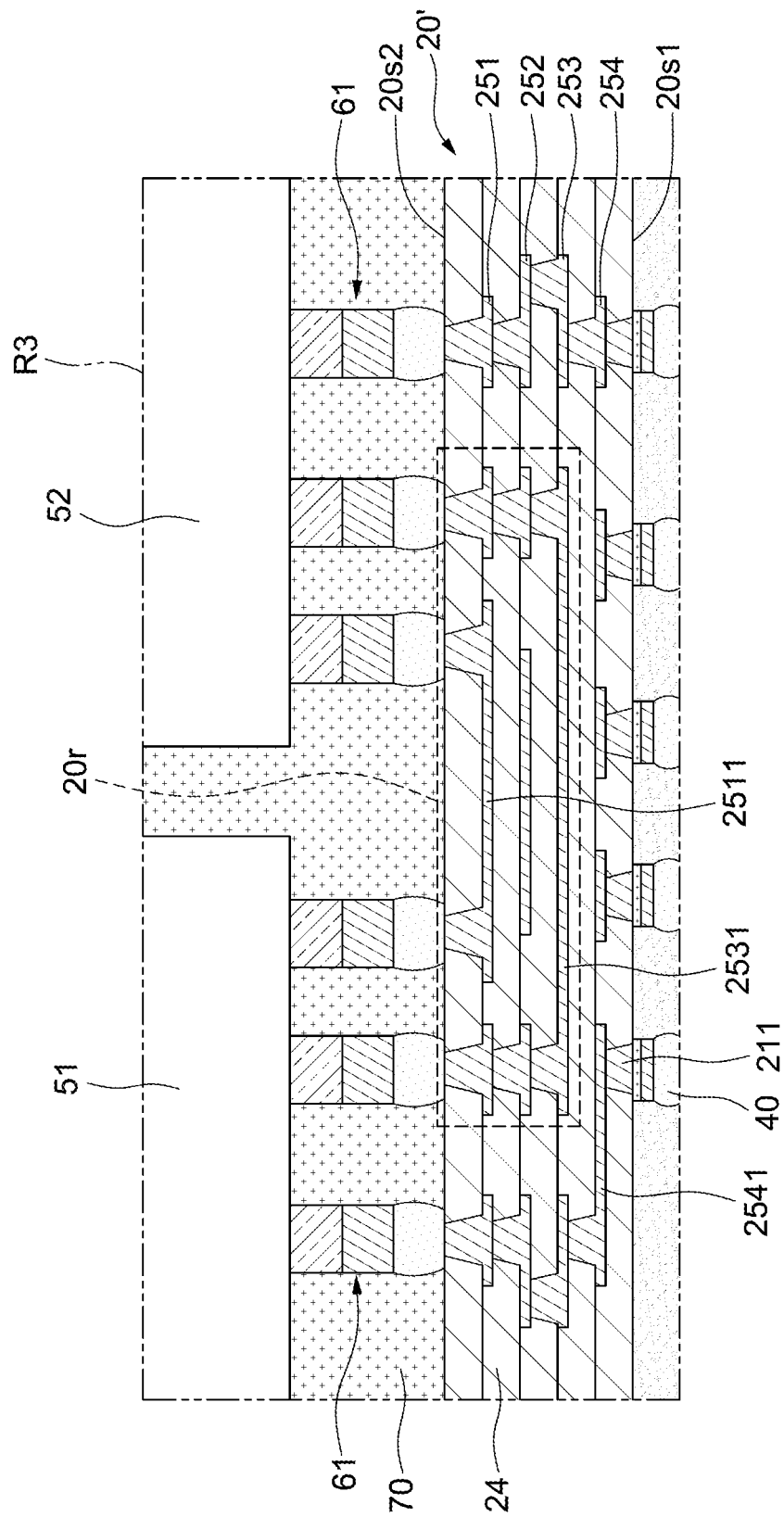
FIG. 2B is a partial enlarged view of the semiconductor package structure of FIG. 2A

FIG. 2B is a partial enlarged view of the region R3 of the semiconductor package structure 1b of FIG. 2A. As shown in FIG. 2B, the upper conductive structure 20 may have a first conductive layer 251, a second conductive layer 252, a third conductive layer 253 and a fourth conductive layer 254 located at different dielectric layers 24. The first conductive layer 251 may have a first trace 2511, the third conductive layer 253 may have a third circuit 2531, and the fourth conductive layer 254 may have a fourth circuit 2541. The first trace 2511 may be configured to electrically connect the first semiconductor device 51 and the second semiconductor device 52, and extend across a gap between the first semiconductor device 51 and the second semiconductor device 52. The third circuit 2531 may be configured to electrically connect the first semiconductor device 51 and the second semiconductor device 52, and extend across a gap between the first semiconductor device 51 and the second semiconductor device 52. The first trace 2511 and the third circuit 2531 may extend from under the first semiconductor device 51 to under the second semiconductor device 52. In this embodiment, the bridge region 20r may be defined as or composed of a region enclosed by an outmost conductive layer of the first trace 2511 and an outmost conductive layer of the third circuit 2531 from a top view (not shown). The fourth circuit 2541 may be located under the bridge region 20r. The fourth circuit 2541 may be located under the third circuit 2531. The fourth circuit 2541 may be configured to electrically connect the first semiconductor device 51 to the lower conductive structure 10. That is, the fourth circuit 2541 may serve as the second path. In some embodiments, a projection of the fourth circuit 2541 on the lower conductive structure 10 exceeds an edge of a projection of the third circuit 2531 on the lower conductive structure 10. In some embodiments, an area of the projection of the fourth circuit 2541 on the lower conductive structure 10 is greater than an area of the projection of the third circuit 2531 on the lower conductive structure 10.

FIG. 3A is a partial enlarged view of the region R2 of the semiconductor package structure 1a of FIG. 1A. The pad 201 of the upper conductive structure 20 may be disposed under and electrically connected to the connecting structure 61. The pad 201 may be exposed from the the second surface 20s2 of the upper conductive structure 20.

FIG. 3B illustrates a cross-sectional view of an example of a semiconductor package structure according to some embodiments of the present disclosure. In some embodiments, the pad 201 shown in FIG. 3A may be omitted. In this embodiment, the via 211 may include a conductive material 2111 and a seed layer 2112. In some embodiments, the conductive material 2111 may be surrounded by the seed layer 2112. The seed layer 2112 may include a first conductive layer 2112a and a second conductive layer 2112b. The conductive material 2111 may be in contact with the first conductive layer 2112a. The conductive material 2111 may include a metal, a metal alloy, or other conductive material. For example, the conductive material 2111 may be formed of copper.

The first conductive layer 2112a may be surrounded by the second conductive layer 2112b. In some embodiments, a portion of the first conductive layer 2112a may be exposed from the second surface 20s2 of the upper conductive structure 20. More specifically, an upper surface of the first conductive layer 2112a may be exposed from the second surface 20s2 of the upper conductive structure 20, and the side surface of the first conductive layer 2112a may be covered by the second conductive layer 2112b. The first conductive layer 2112a may include a metal, a metal alloy, or other conductive material. For example, the conductive material 2111 may be formed of copper.

The second conductive layer 2112b may be in contact with the dielectric layer 24 of the upper conductive structure 20. A portion of the second conductive layer 2112b may be exposed from the second surface 20s2 of the upper conductive structure 20. In some embodiments, the first conductive layer 2112a and the second conductive layer 2112b may define a recess 211r. In some embodiments, a portion of the connecting structure 61 may be disposed within the recess 211r. In some embodiments, a portion of the first connecting structure 61 may be in contact with the first conductive layer 2112a and the second conductive layer 2112b. The second conductive layer 2112b may include, for example, a titanium, tantalum or titanium tungsten.

Figure 4:
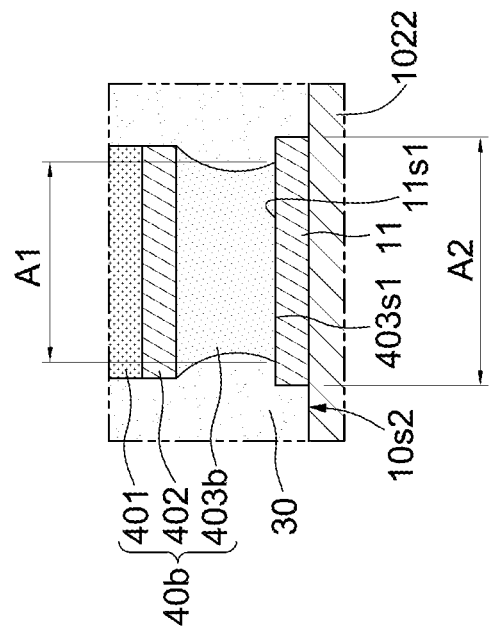
FIG. 4 is a cross-sectional view of an example of a conductive structure according to some embodiments of the present disclosure.

FIG. 4 is a cross-sectional view of an example of an interconnection structure 40a according to some embodiments of the present disclosure. In some embodiments, the interconnection structure 40a may include an interconnect element 403a. In some embodiments, the interconnect element 403a may have a ball-shaped profile. The interconnect element 403a may be convex toward the bonding layer 30. That is, the interconnect element 403a may have a less diameter at two opposite sides and a greater diameter at the center portion. The interconnect element 403a may have a surface 403s1. The surface 403s1 may be in contact with the first pad 11 and have an area A1. The first pad 11 may have a surface 11s1 in contact with the interconnect element 403a and have an area A2. In some embodiments, the bonding layer 30 may be formed of the NCP. In this embodiment, the area A1 of the surface 403s1 of the interconnect element 403a may be less than the area A2 of the surface 11s1 of first pad 11. When the bonding layer 30 is formed of the NCP, the interconnect element 403a may have a ripple pattern 4031 carved in a side surface of the interconnect element 403a.

Figure 5:
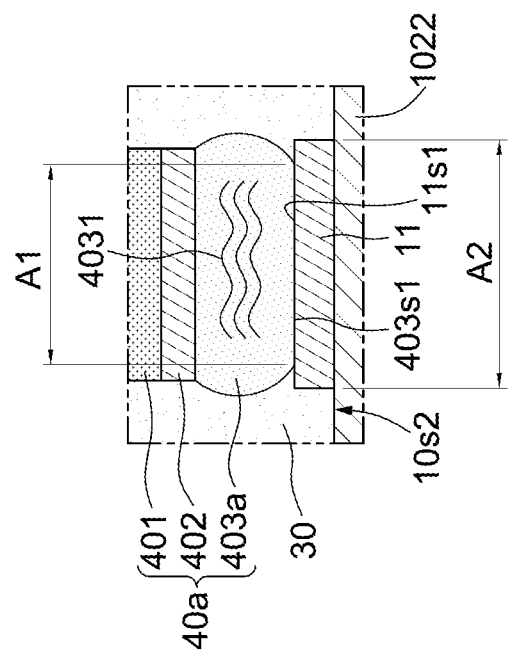
FIG. 5 is a cross-sectional view of an example of a conductive structure according to some embodiments of the present disclosure.

FIG. 5 is a cross-sectional view of an example of an interconnection structure 40b according to some embodiments of the present disclosure. The structure of the interconnection structure 40b may be similar to that of the interconnection structure 40a of FIG. 4 except for the interconnect element 403b of the interconnection structure 40b. In some embodiments, the interconnect element 403b may have a neck portion. The neck portion may be located at the center of the interconnect element 403b. That is, the interconnect element 403b may be concaved from the bonding layer 30. The interconnect element 403b may have a less diameter at the center portion and a greater diameter at two opposite sides. In some embodiments, the bonding layer 30 may be formed of the NCP. In this embodiment, the area A1 of the interconnect element 403b of the interconnection structure 40b may be less than the area A2 of the first pad 11.

FIG. 6 is a cross-sectional view of an example of an interconnection structure 40c according to some embodiments of the present disclosure. The structure of the interconnection structure 40c may be similar to that of the interconnection structure 40a of FIG. 4 except for the interconnect element 403c of the interconnection structure 40c. In some embodiments, the interconnect element 403c may have a substantially straight sidewall. The interconnect element 403c may be tapered from the conductive layer 402 to the first pad 11. In some embodiments, the bonding layer 30 may be formed of the NCP. In this embodiment, the area A1 of the interconnect element 403c of the interconnection structure 40c may be less than the area A2 of the first pad 11.

FIG. 7 is a cross-sectional view of an example of an interconnection structure 40d according to some embodiments of the present disclosure. The structure of the interconnection structure 40d may be similar to that of the interconnection structure 40a of FIG. 4 except for the interconnect element 403d of the interconnection structure 40d. In some embodiments, the bonding layer 30 may be formed of the NCF. In this embodiment, the area A1 of the interconnect element 403d may be substantially equal to the area A2 of the first pad 11. In other embodiments, when the bonding layer 30 is formed of the NCF, the interconnect element 403d may have a neck portion or a substantially straight sidewall. In these embodiments, the area A1 of the interconnect element 403d of the interconnection structure 40d may be substantially equal to the area A2 of the first pad 11.

Figure 8A:
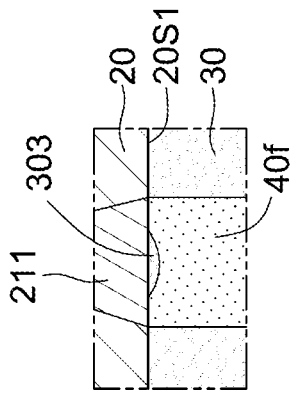
FIG. 8A is a partial enlarged view of FIG. 7.

FIG. 8A is a partial enlarged view of FIG. 7. In some embodiments, a space 301 may be formed between the interconnection structure 40d, the bonding layer 30 and the upper conductive structure 20. The space 301 may be filled with air other suitable gas. For example, the space 301 may be formed within a space surrounded by the upper conductive structure 20, the bonding layer 30 and the interconnection structure 40d.

Figure 8B:
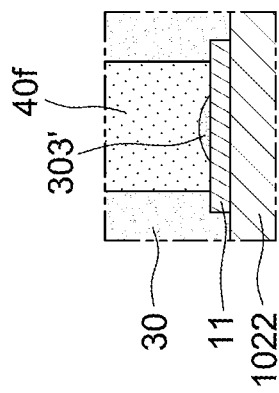
FIG. 8B is a partial enlarged view of FIG. 7.

FIG. 8B is a partial enlarged view of FIG. 7. In some embodiments, a space 301' may be formed between the interconnect element 403d of the interconnection structure 40d, the lower conductive structure 10 and the bonding layer 30. The space 301' may be filled with air other suitable gas. For example, the space 301' may be formed between the interconnect element 403d and the bonding layer 30. In some embodiments, the space 301' may be formed within a space constituted by the lower conductive structure 10, the bonding layer 30 and the interconnect element 403*d*.

Figure 9A:
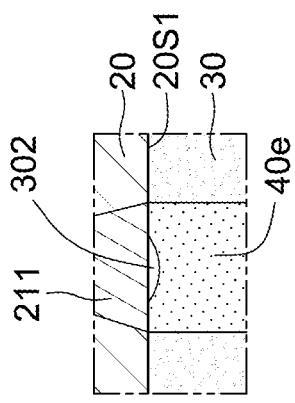
FIG. 9A is a cross-sectional view of an example of a conductive structure according to some embodiments of the present disclosure.

FIG. 9A is a cross-sectional view of an example of an interconnection structure 40*e* according to some embodiments of the present disclosure. In some embodiments, the interconnection structure 40*e* may be formed of a metal pillar, such as a copper layer, extending from the upper conductive structure 20 to the first pad 11 of the lower conductive structure 10. In this embodiment, when the bonding layer 30 is formed of a capillary underfill (CUF) or NCF, the interconnection structure 40*e* may include at least one void 302 formed therein. For example, the void 302 may be formed under the upper conductive structure 20. The void 302 may be filled with air or other suitable gas. A portion of the via 211 may be exposed to air.

Figure 9B:
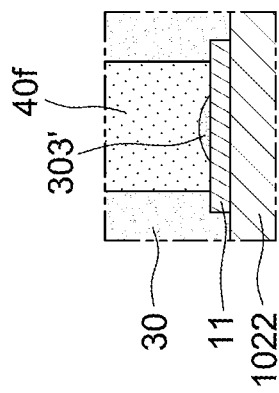
FIG. 9B is a cross-sectional view of an example of a conductive structure according to some embodiments of the present disclosure.

FIG. 9B is a cross-sectional view of an example of an interconnection structure 40*e* according to some embodiments of the present disclosure. In this embodiment, when the bonding layer 30 is formed of a capillary underfill (CUF) or NCF, the interconnection structure 40*e* may include at least one void 302' formed therein. For example, the void 302' may be formed over the first pad 11. The void 302' may be filled with air or other suitable gas. A portion of the first pad 11 may be exposed to air. n this embodiment, there is at least one void 302' between the interconnection structure 40*e* and the first pad 11 of the lower conductive structure 10.

Figure 10A:
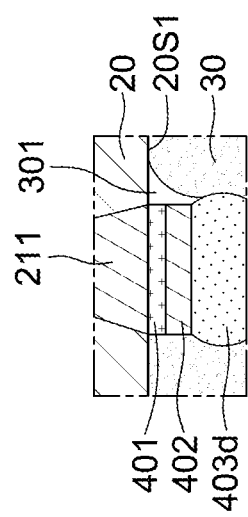
FIG. 10A is a cross-sectional view of an example of a conductive structure according to some embodiments of the present disclosure.

FIG. 10A is a cross-sectional view of an example of an interconnection structure 40*f* according to some embodiments of the present disclosure. In some embodiments, the interconnection structure 40*f* may be formed of a metal pillar, such as a copper layer, extending from the upper conductive structure 20 to the first pad 11 of the lower conductive structure 10. The metal pillar connects the first pad 11. In this embodiment, when the bonding layer 30 is formed of the NCP, at least one void 303 may be formed in the interconnection structure 40*f*. For example, the void 303 may be formed under the upper conductive structure 20, and a dielectric material, such as the material of the bonding layer 30, may fill the void 303.

Figure 10B:
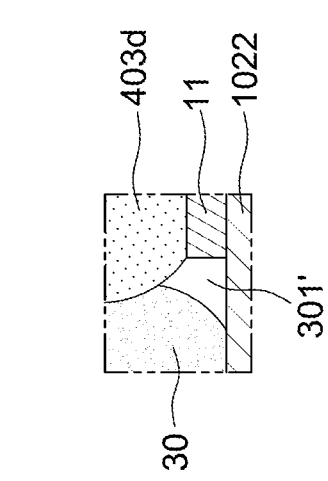
FIG. 10B is a cross-sectional view of an example of a conductive structure according to some embodiments of the present disclosure.

FIG. 10B is a cross-sectional view of an example of an interconnection structure 40*f* according to some embodiments of the present disclosure. In this embodiment, when the bonding layer 30 is formed of the NCP, at least one void 303' may be formed in the interconnection structure 40*f*. For example, the void 303' may be formed over the first pad 11, and a dielectric material, such as the material of the bonding layer 30, may fill the void 303'.

Figure 11:
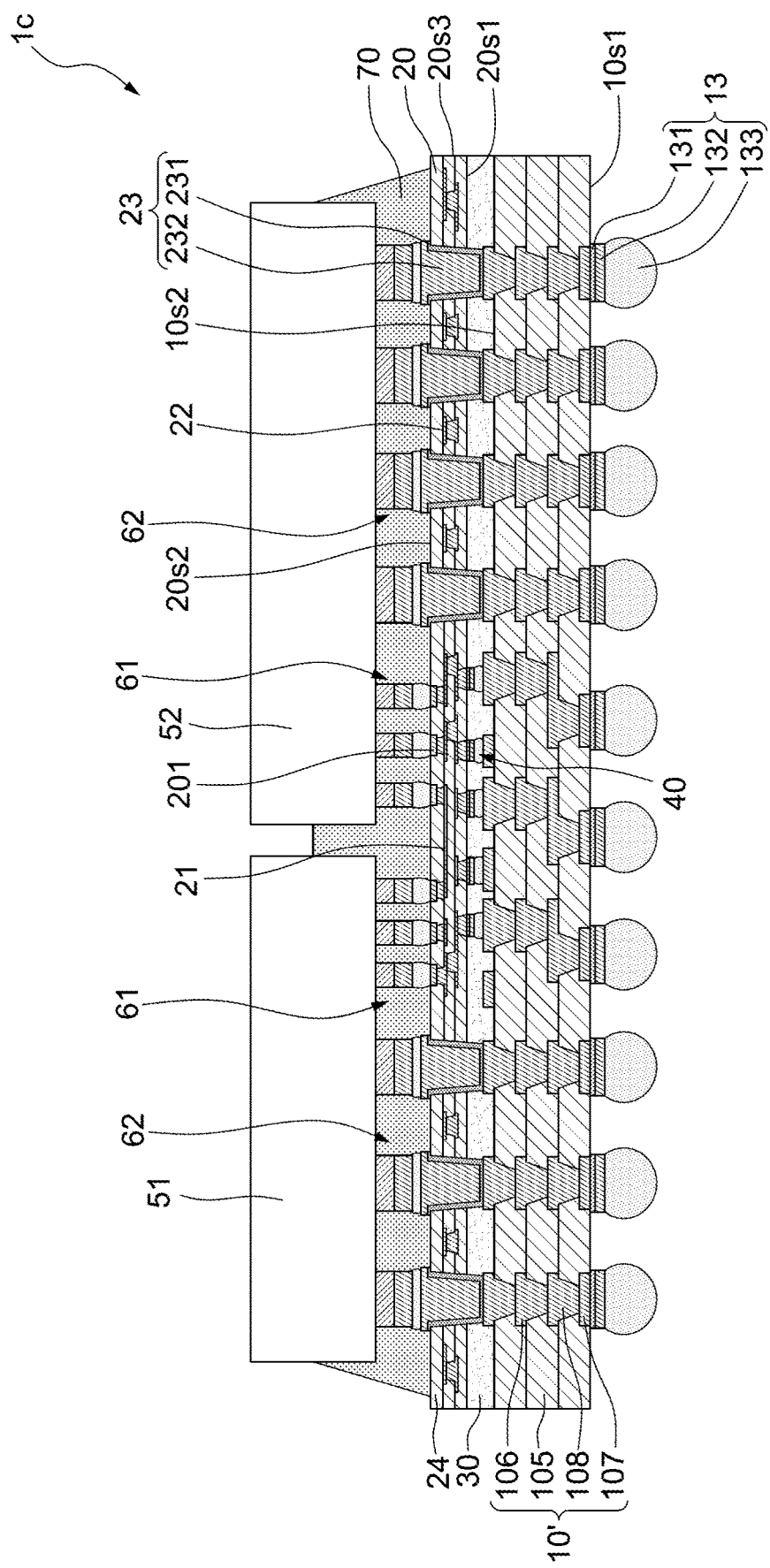
FIG. 11 illustrates a cross-sectional view of an example of a semiconductor package structure according to some embodiments of the present disclosure.

FIG. 11 illustrates a cross-sectional view of an example of a semiconductor package structure 1*c* according to some embodiments of the present disclosure. The semiconductor package structure 1*c* may be similar to the semiconductor package structure 1*a* of FIG. 1A except that the semiconductor package structure 1*c* may include a lower conductive structure 10' replacing the lower conductive structure 10. In some embodiments, the lower conductive structure 10' may be a coreless substrate, and may include at least one dielectric layer (including, for example, three dielectric layers 105), at least one circuit layer (including, for example, three upper circuit layers 106 and one lower circuit layer 107 formed of a metal, a metal alloy, or other conductive material) in contact with the dielectric layer(s) 105 and at least one inner conductive via 108 (including, for example, a plurality of inner conductive vias 108).

FIG. 12 through FIG. 27 illustrate a method for manufacturing a semiconductor package structure according to some embodiments of the present disclosure. In some embodiments, the method is for manufacturing the semiconductor package structure 1*a* shown in FIG. 1A.

Figure 12:
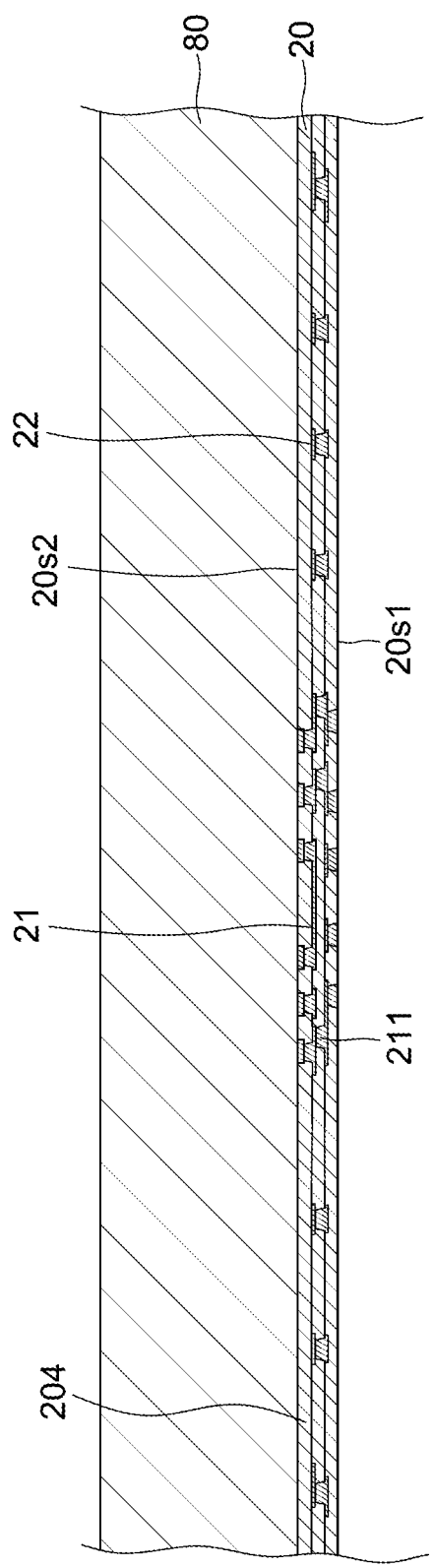
FIG. 12 illustrates one or more stages of an example of a method for manufacturing a semiconductor package structure according to some embodiments of the present disclosure.

Referring to FIG. 12, a carrier 80 is provided. The carrier 80 may be a glass carrier, and may be in a wafer type, a panel type or a strip type. Then, an upper conductive structure 20 is formed on the carrier 80. The upper conductive structure 20 may have a first surface 20*s*1 and a second surface 20*s*2 opposite to the first surface 20*s*1. The second surface 20*s*2 of the upper conductive structure 20 may be in contact with the carrier 80. A plurality of dielectric layer 24 may be formed on the carrier 80, and a plurality of vias 211 and circuit layers may be formed in and/or on the dielectric layer 24 to define a high-density circuit 21 and a low-density circuit 22. The line space of the high-density circuit 21 may be less than that of the low-density circuit 22, and the high-density circuit 21 may be surrounded by the low-density circuit 22.

Figure 13:
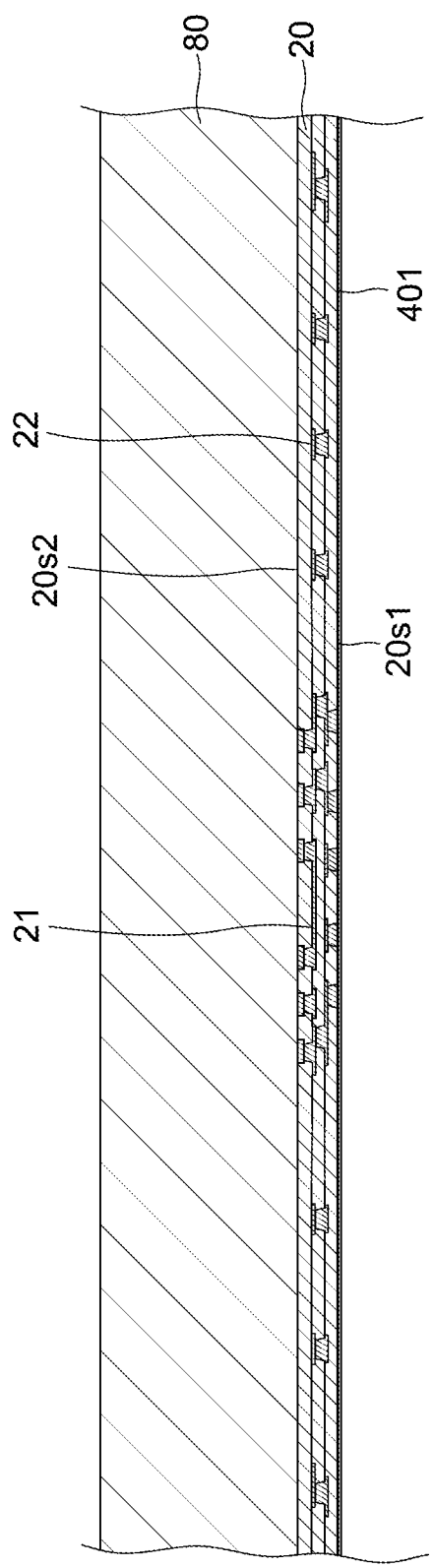
FIG. 13 illustrates one or more stages of an example of a method for manufacturing a semiconductor package structure according to some embodiments of the present disclosure.

Referring to FIG. 13, a seed layer 401 may be formed on the first surface 20*s*1 of the upper conductive structure 20 by a physical vapor deposition (PVD) technique, a plating technique or other suitable techniques. The seed layer 401 may be in contact with the high-density circuit 21 of the upper conductive structure 20.

Figure 14:
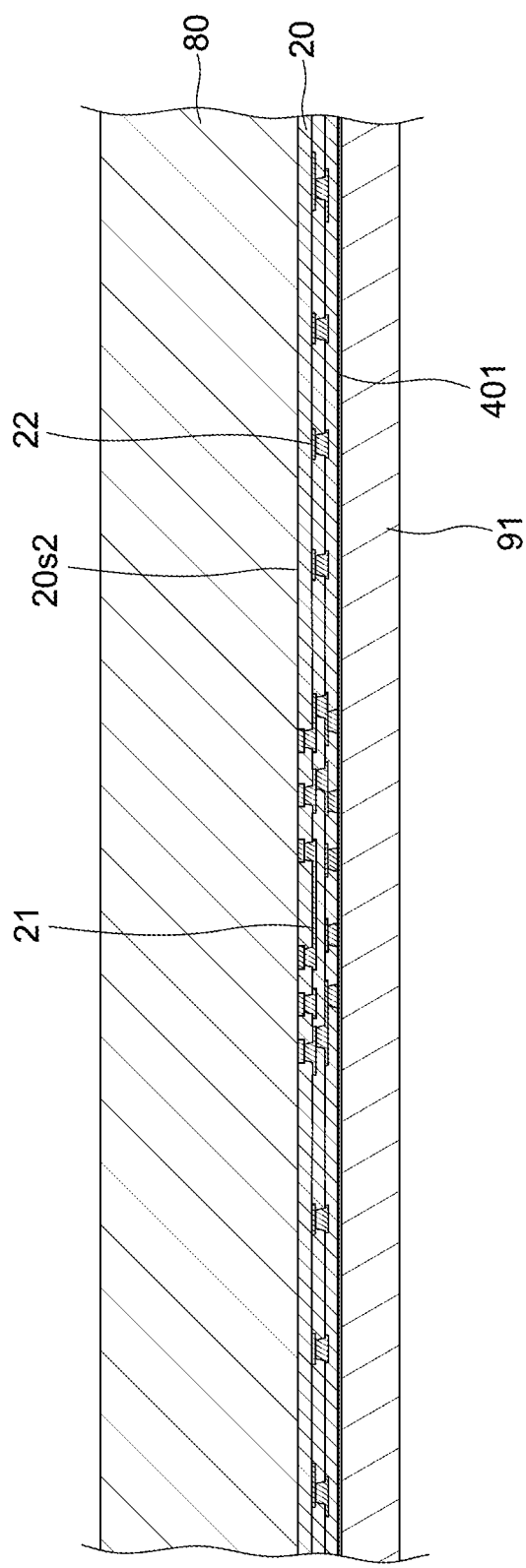
FIG. 14 illustrates one or more stages of an example of a method for manufacturing a semiconductor package structure according to some embodiments of the present disclosure.

Referring to FIG. 14, a photoresist 91 may be formed on and cover the seed layer 401.

Figure 15:
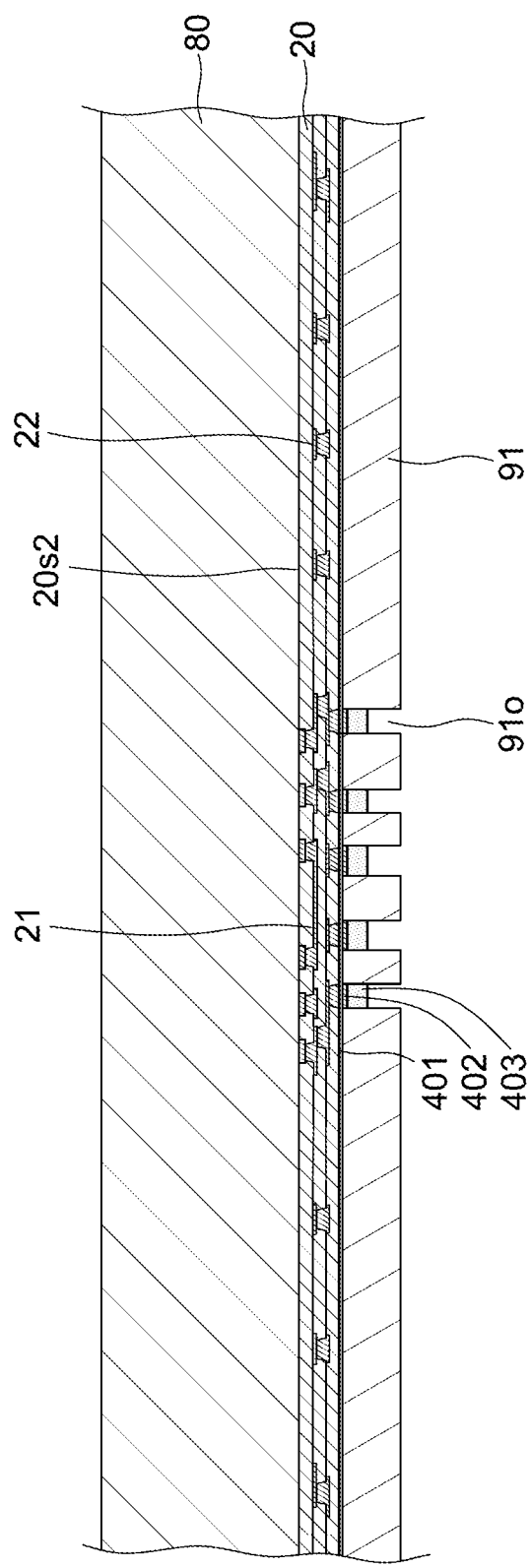
FIG. 15 illustrates one or more stages of an example of a method for manufacturing a semiconductor package structure according to some embodiments of the present disclosure.

Referring to FIG. 15, the photoresist 91 may be patterned to define a plurality of openings 910 such that a portion of the seed layer 401 may be exposed. Then, a conductive layer 402 and an interconnect element 403 may be formed on the seed layer 401 and within the openings 910 of the photoresist 91. The conductive layer 402 may be formed by a plating technique or other suitable techniques.

Figure 16:
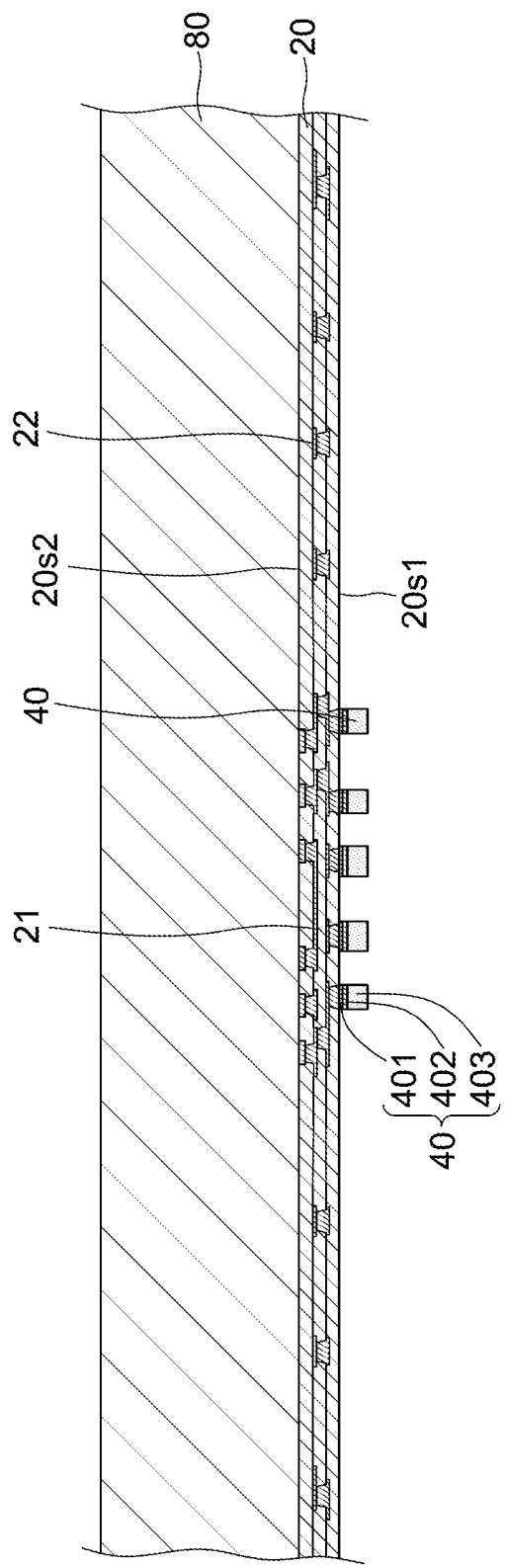
FIG. 16 illustrates one or more stages of an example of a method for manufacturing a semiconductor package structure according to some embodiments of the present disclosure.

Referring to FIG. 16, the photoresist 91 may be removed by a stripping technique or other suitable techniques, and an interconnection structure 40, including the seed layer 401, the conductive layer 402 and the interconnect element 403 may be formed on the first surface 20*s*1 of the upper conductive structure 20. In some embodiments, portions of the seed layer 401 covered by the photoresist 91 are removed such that a portion of the upper conductive structure 20 is exposed. The interconnection structure 40 may be electrically connected to the high-density circuit 21 of the upper conductive structure 20.

Figure 17:
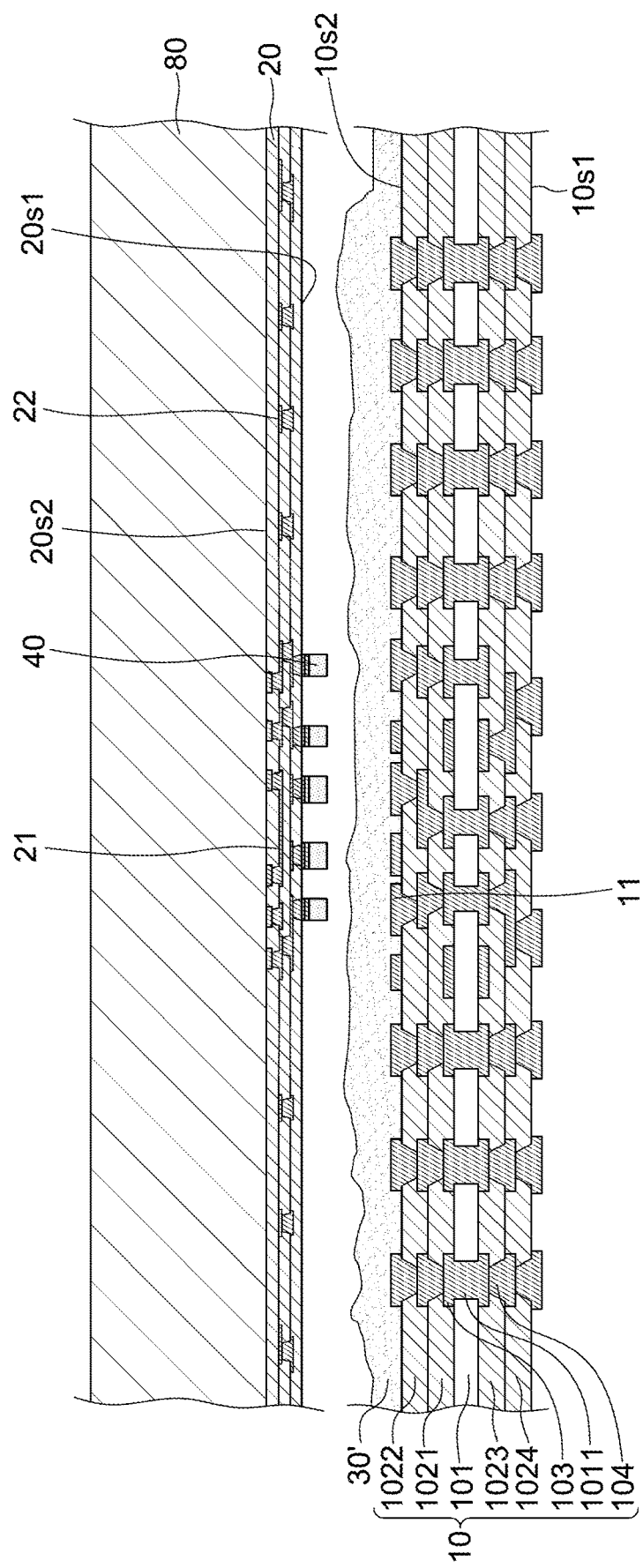
FIG. 17 illustrates one or more stages of an example of a method for manufacturing a semiconductor package structure according to some embodiments of the present disclosure.

Referring to FIG. 17, a lower conductive structure 10 is provided. The lower conductive structure 10 may include a first surface 10*s*1 and a second surface 10*s*2 opposite to the first surface 10*s*1. The lower conductive structure 10 may include a core portion 101, a plurality of dielectric layers 1021, 1022, 1023 and 1024, a plurality of circuit layers 103 and a plurality of interconnection vias 104, a plurality of first pads 11 and a plurality of second pads 12. A non-conductive material 30' may be formed or applied on the second surface 10*s*2 of the lower conductive structure 10 by a coating technique or other suitable techniques. The non-conductive material 30' may cover the first pads 11, the second pads 12 and the second surface 10*s*2 of the lower conductive structure 10.

Figure 18:
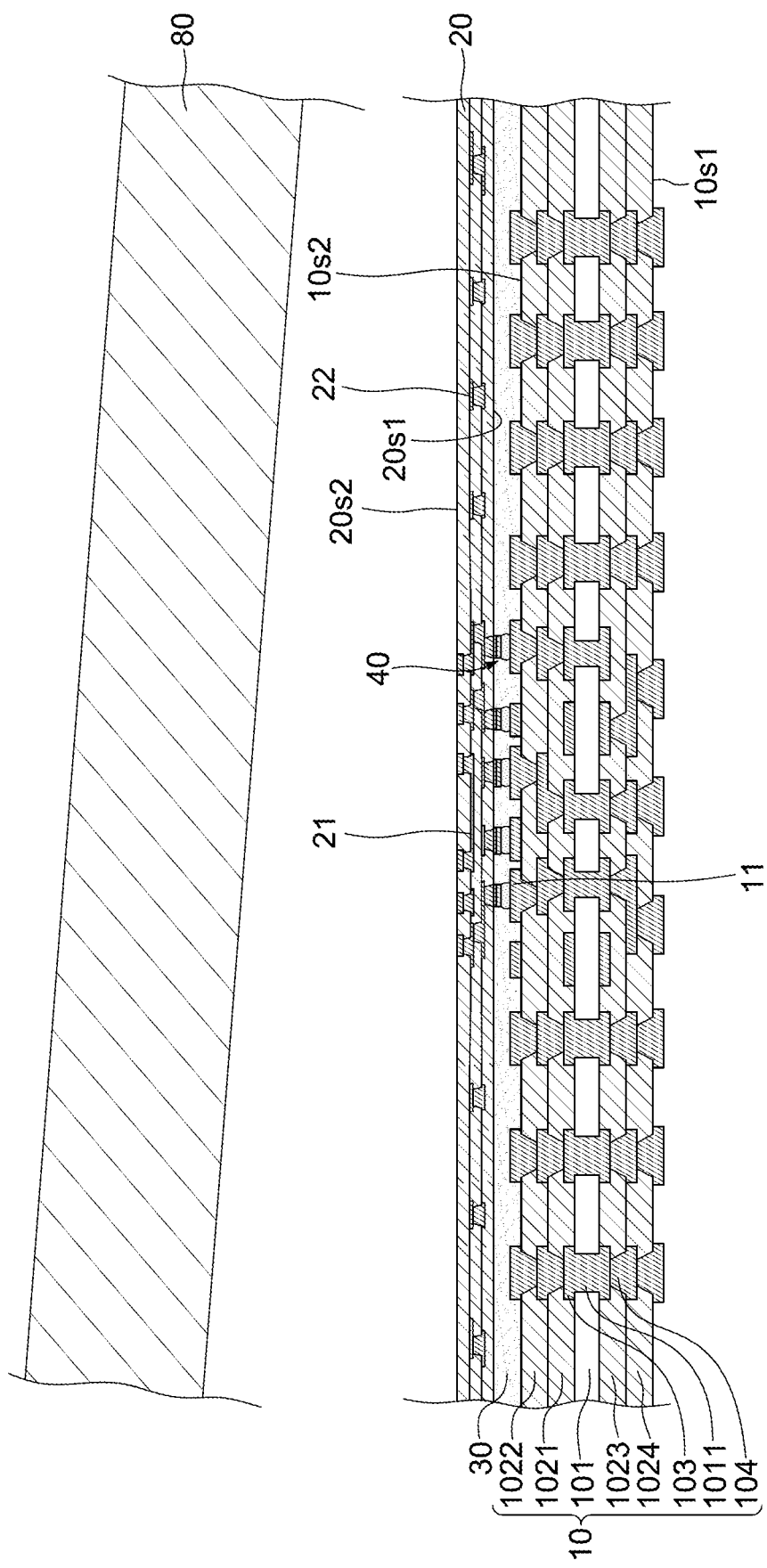
FIG. 18 illustrates one or more stages of an example of a method for manufacturing a semiconductor package structure according to some embodiments of the present disclosure.

Referring to FIG. 18, the interconnection structure 40 may be bonded to the lower conductive structure 10, and the carrier 80 may be removed. The upper conductive structure 20 and the interconnection structure 40 may be pressed into the non-conductive material 30' and then the non-conductive material 30' may be cured to form the bonding layer 30. A heating process may be performed to form the interconnection structure 40. The heating process may include a reflow process. The upper conductive structure 20 and the interconnection structure 40 may be embedded in the bonding layer 30. The interconnection structure 40 may be vertically aligned and electrically connected to the first pads 11 of the lower conductive structure 10 such that the high-density circuit 21 of the upper conductive structure 20 may be electrically connected to the lower conductive structure 10 through a second path (e.g., through the interconnection structure 40).

Figure 19:
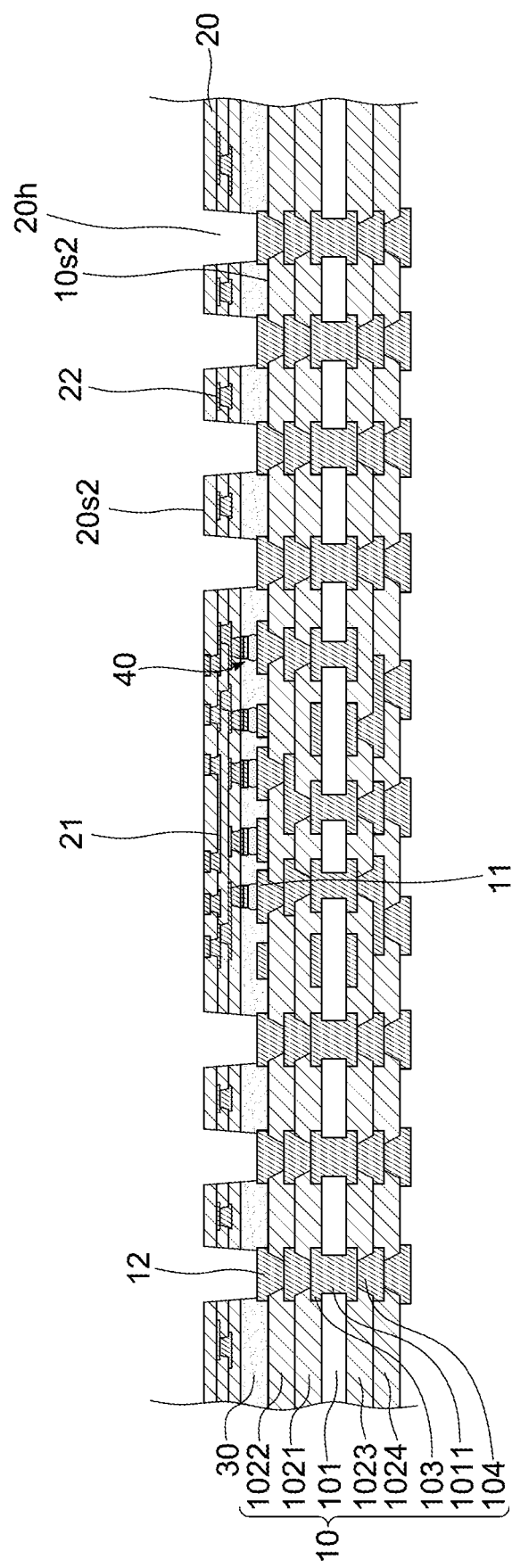
FIG. 19 illustrates one or more stages of an example of a method for manufacturing a semiconductor package structure according to some embodiments of the present disclosure.

Referring to FIG. 19, a portion of the upper conductive structure 20 and the bonding layer 30 may be removed through laser drilling or plasma etching to form a plurality of holes 20h such that the second pads 12 of the lower conductive structure 10 are exposed. The holes 20h may extend through the upper conductive structure 20 and a portion of the bonding layer 30, and may terminate at or on second pads 12 of the lower conductive structure 10. The holes 20h and the low-density circuit 22 may be arranged alternatively.

Figure 20:
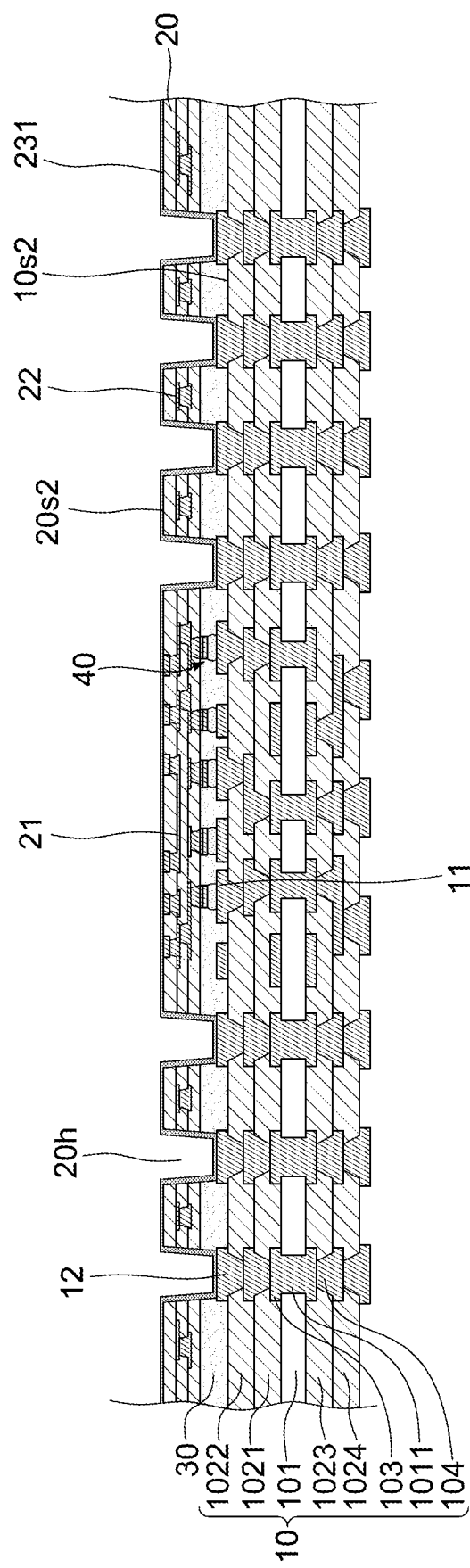
FIG. 20 illustrates one or more stages of an example of a method for manufacturing a semiconductor package structure according to some embodiments of the present disclosure.

Referring to FIG. 20, a seed layer 231 may be formed on the second pads 12, the second surface 20s2 of the upper conductive structure 20 and within the holes 20h of the upper conductive structure 20 by a PVD technique, a plating technique or other suitable techniques.

Figure 21:
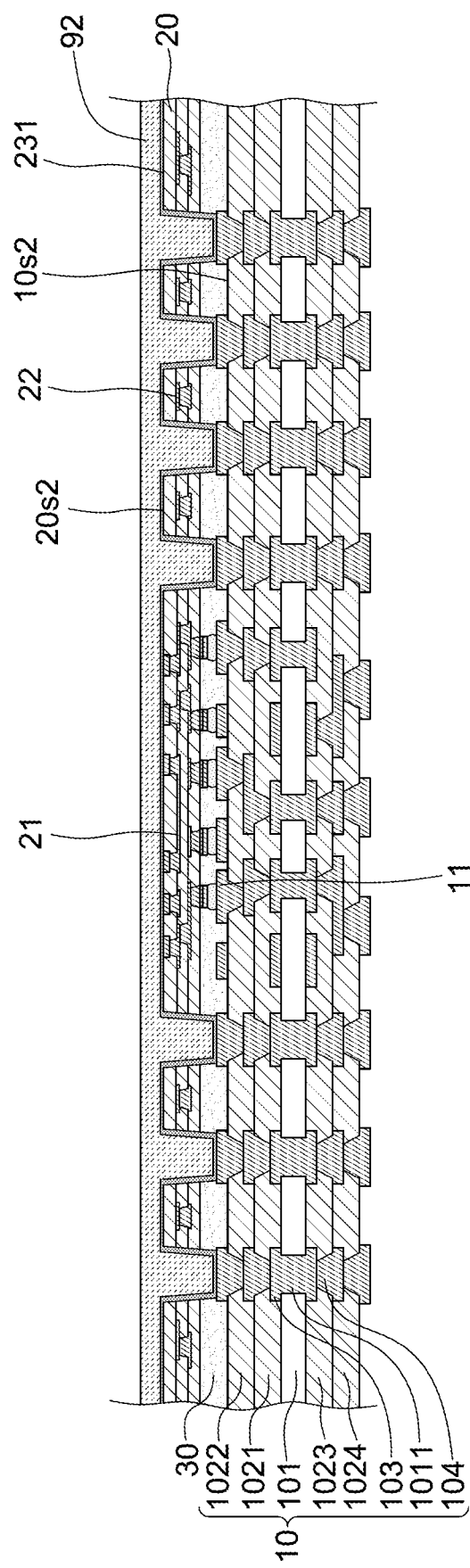
FIG. 21 illustrates one or more stages of an example of a method for manufacturing a semiconductor package structure according to some embodiments of the present disclosure.

Referring to FIG. 21, a photoresist 92 may be formed on the seed layer 231 and fill in the holes 20h of the upper conductive structure 20.

Figure 22:
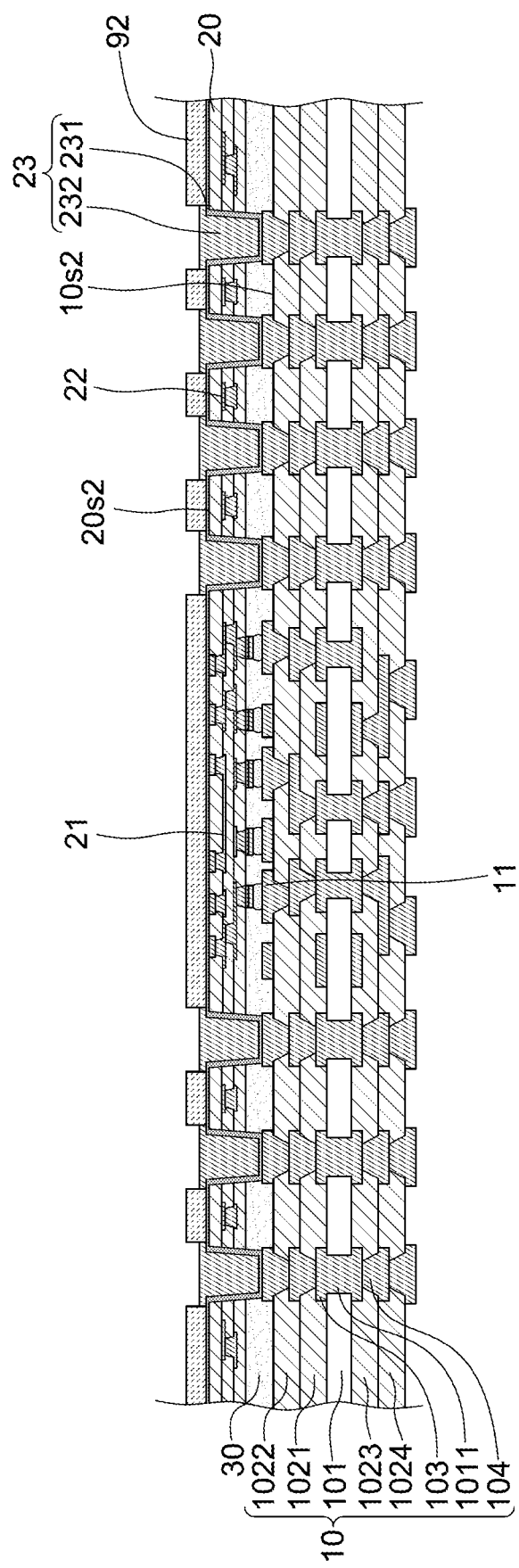
FIG. 22 illustrates one or more stages of an example of a method for manufacturing a semiconductor package structure according to some embodiments of the present disclosure.

Referring to FIG. 22, the photoresist 92 may be patterned to define a plurality of openings to expose a portion of the seed layer 231. Then, a conductive material 232 may be formed to fill the openings of the photoresist 92. The conductive material 232 may cover and in contact with the seed layer 231. The conductive material 232 may cover a portion of the second surface 20s2 of the upper conductive structure 20. Meanwhile, conductive vias 23, including the seed layer 231 and the conductive material 232, are created on the second surface 10s2 of the lower conductive structure 10 and electrically connected to the lower conductive structure 10.

Figure 23:
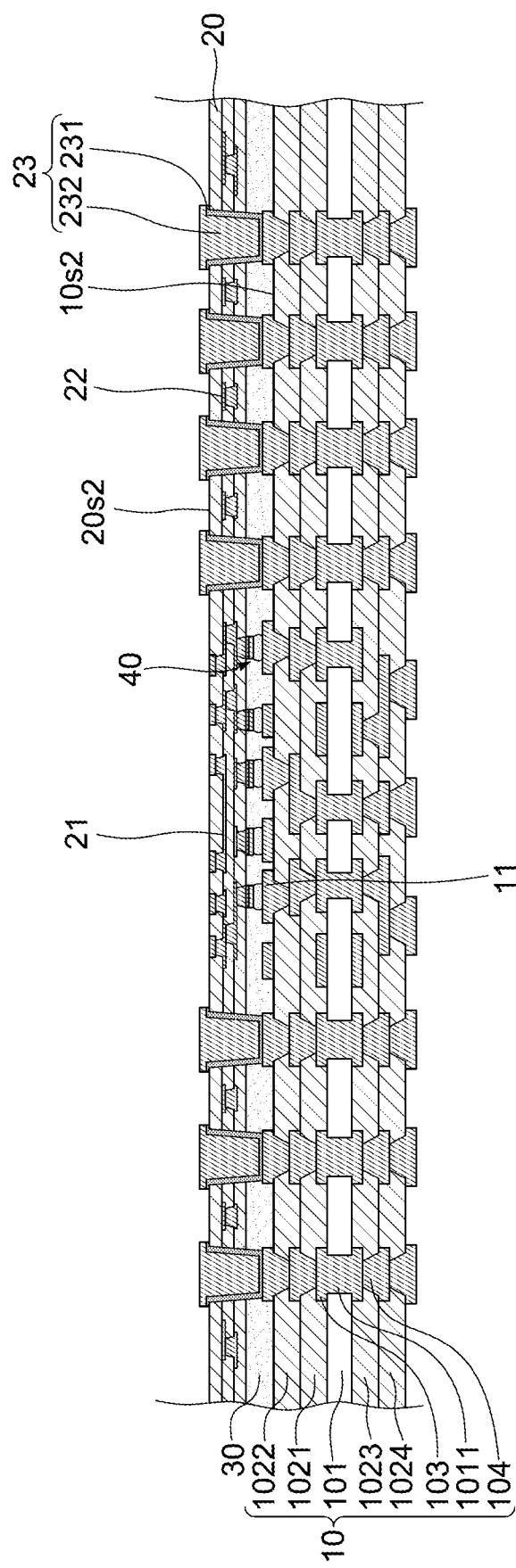
FIG. 23 illustrates one or more stages of an example of a method for manufacturing a semiconductor package structure according to some embodiments of the present disclosure.

Referring to FIG. 23, the photoresist 92 may be removed by a stripping technique or other suitable techniques. The second surface 20s2 of the upper conductive structure 20 and a portion of the high-density circuit 21 of the upper conductive structure 20 may be exposed.

Figure 24:
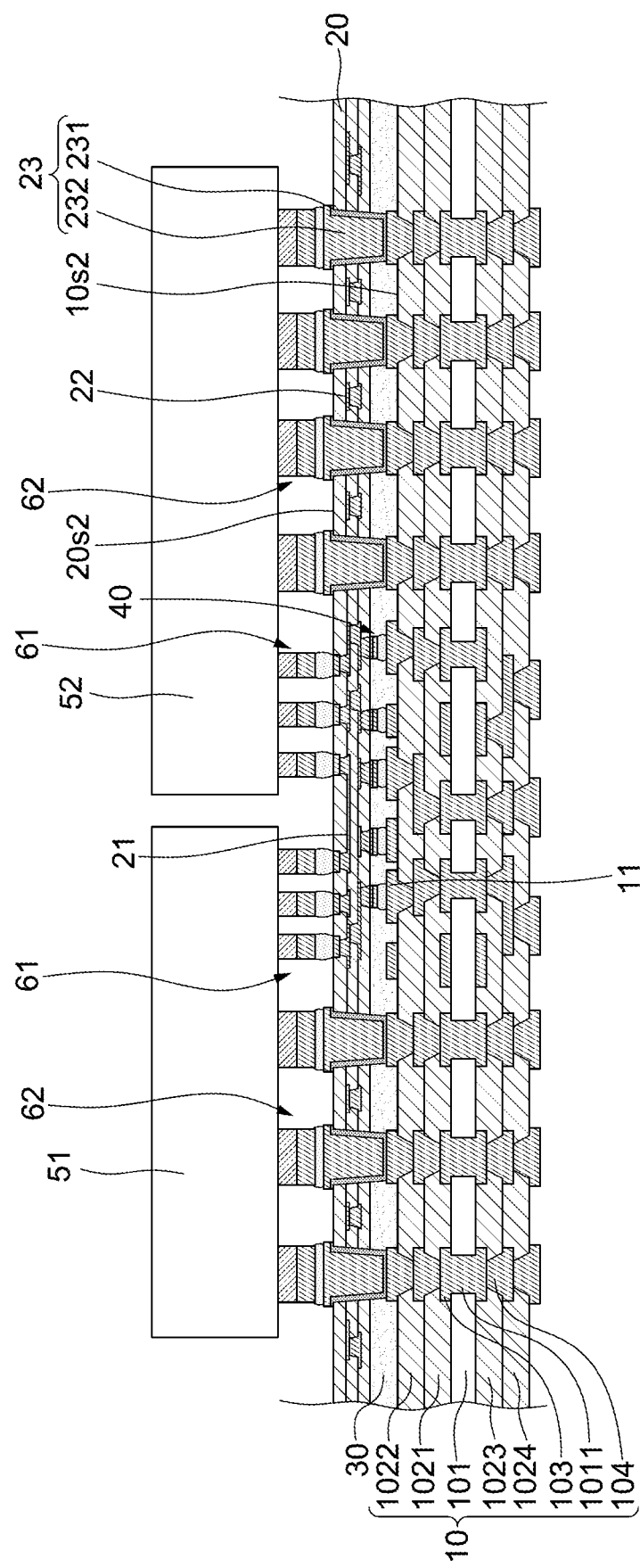
FIG. 24 illustrates one or more stages of an example of a method for manufacturing a semiconductor package structure according to some embodiments of the present disclosure.

Referring to FIG. 24, a first semiconductor device 51 and a second semiconductor device 52 may be attached to the upper conductive structure 20. The first semiconductor device 51 and/or the second semiconductor device 52 may be attached to the high-density circuit 21 by the first connecting structures 61 and attached to the conductive vias 23 by the second connecting structures 62. A vacuum nozzle (not shown) may be used to attach the first semiconductor device 51 and/or the second semiconductor device 52 to the upper conductive structure 20. Further, a reflow technique may be performed to solder the first connecting structures 61 and the upper conductive structure 20 as well as the second connecting structures 62 and the upper conductive structure 20. The first semiconductor device 51 may be electrically connected to the second semiconductor device 52 through a first path, e.g., through the high-density circuit 21 of the upper conductive structure 20. Further, the first semiconductor device 51 or the second semiconductor device 52 may be electrically to the lower conductive structure 10 through a second path, e.g., through the interconnection structure 40.

Figure 25:
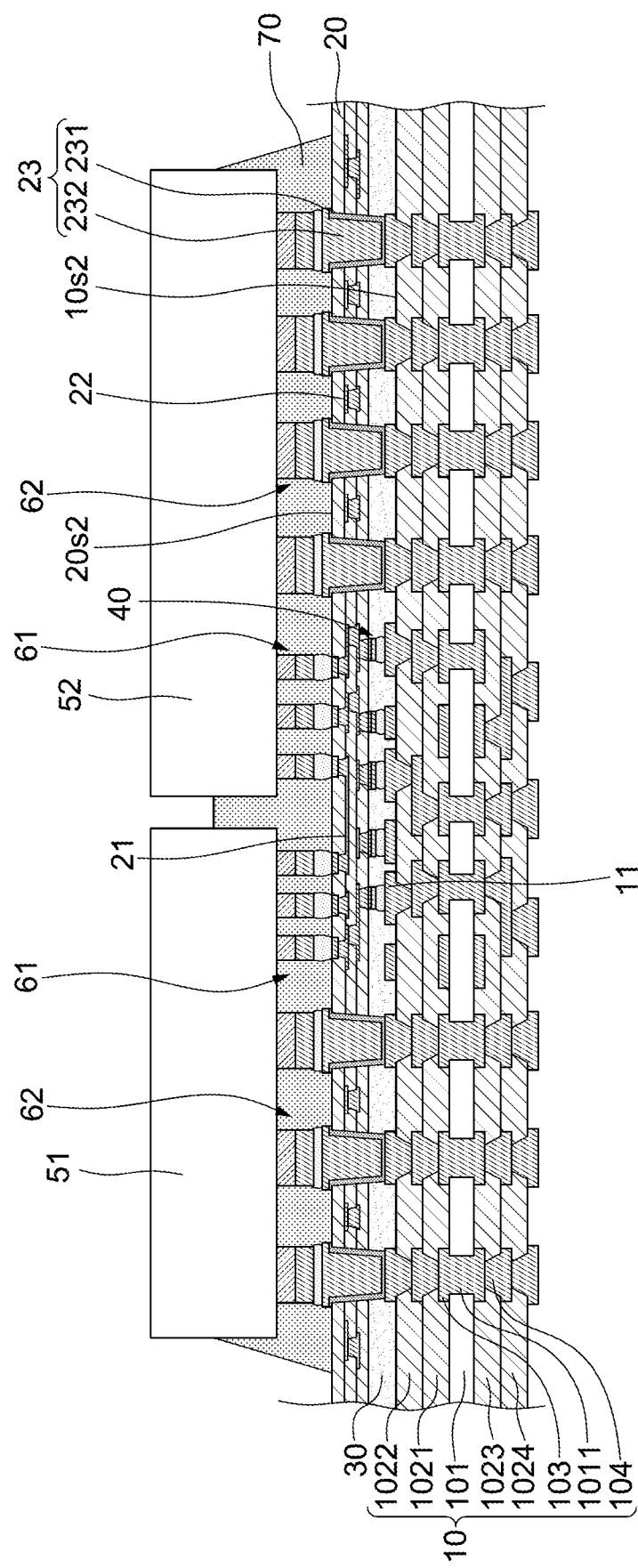
FIG. 25 illustrates one or more stages of an example of a method for manufacturing a semiconductor package structure according to some embodiments of the present disclosure.

Referring to FIG. 25, an underfill 70 may be formed in a space between the first semiconductor device 51 and the second surface 20s2 of the upper conductive structure 20, and in a space between the second semiconductor device 52 and the second surface 20s2 of the upper conductive structure 20 to protect the first connecting structures 61 and the second connecting structures 62.

Figure 26:
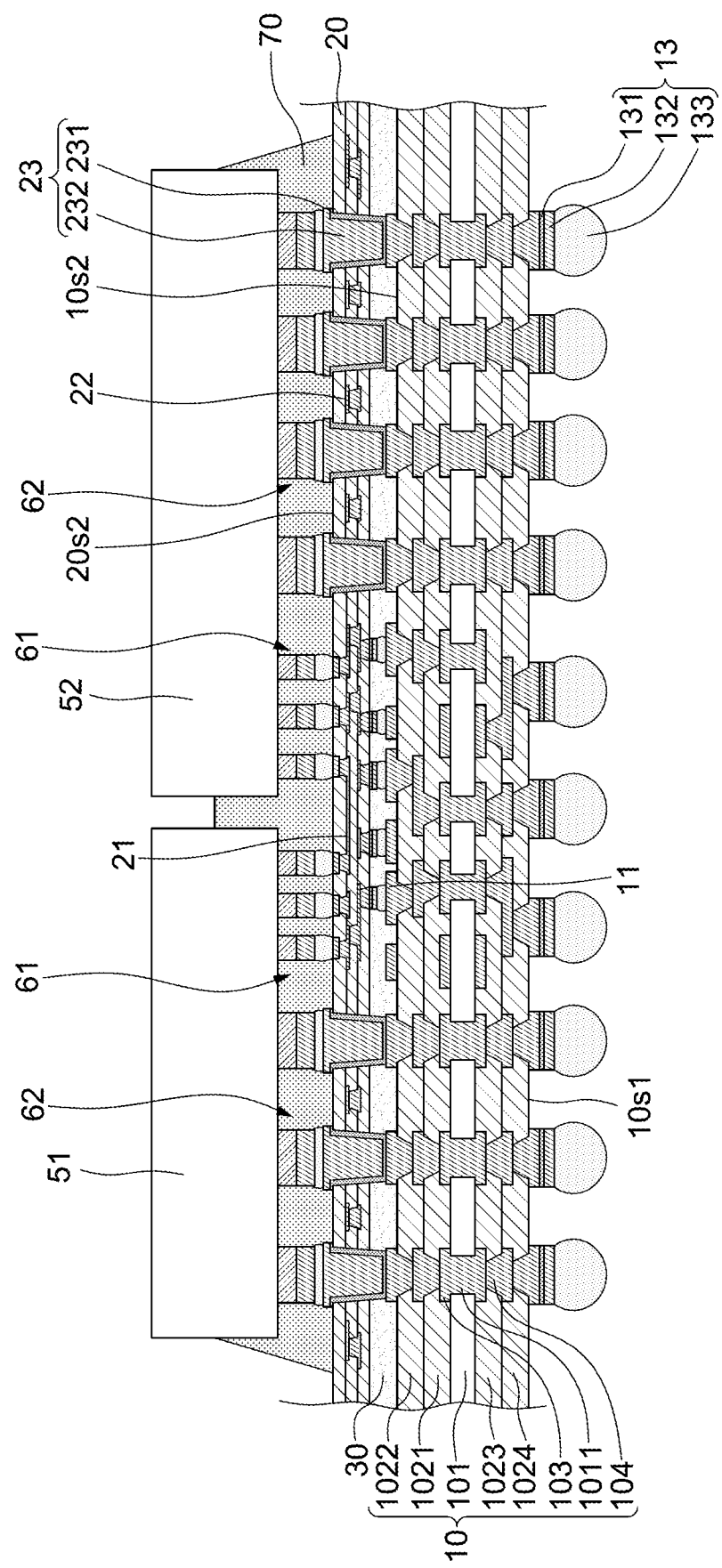
FIG. 26 illustrates one or more stages of an example of a method for manufacturing a semiconductor package structure according to some embodiments of the present disclosure.

Referring to FIG. 26, a seed layer 131, a conductive layer 132 and bumps 133 may be formed on the first surface 10s1 of the lower conductive structure 10 to create a plurality of connecting structures 13. A photoresist (not shown) may be formed and patterned on the first surface 10s1 of the lower conductive structure 10. Then, the seed layer 131 and the conductive layer 132 may be formed on the first surface 10s1 of the lower conductive structure 10. The bumps 133 may be formed on the conductive layer 132 through ball drop technique or other suitable techniques.

Figure 27:
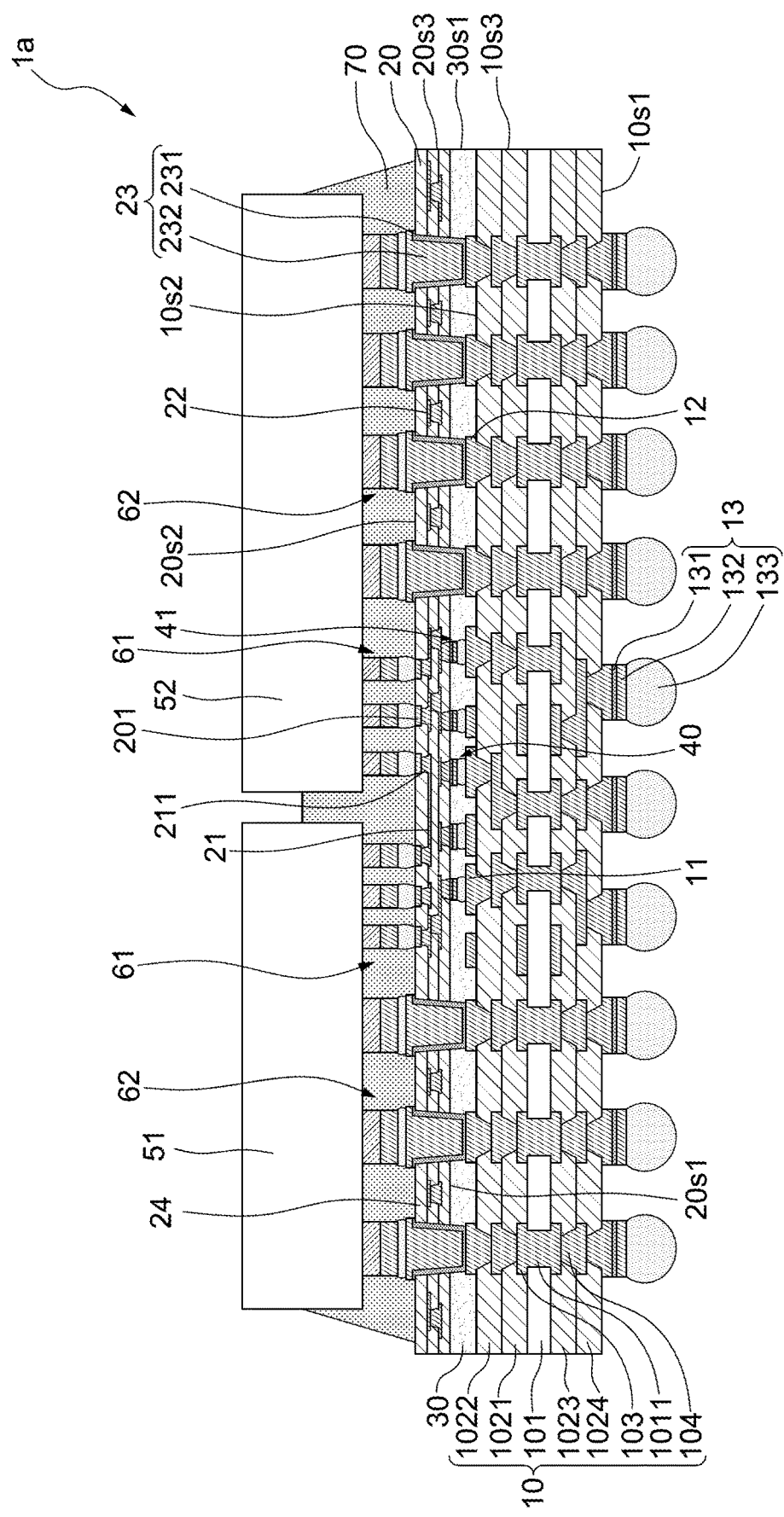
FIG. 27 illustrates one or more stages of an example of a method for manufacturing a semiconductor package structure according to some embodiments of the present disclosure.

Referring to FIG. 27, a singulation technique may be performed to form a plurality of semiconductor package structures 1a as shown in FIG. 1A. Since a saw (not shown) may be used to cut the lower conductive structure 10, the upper conductive structure 20 and the bonding layer 30, the side surface 10s3 of the lower conductive structure 10, the side surface 20s3 of the upper conductive structure 20 and the side surface 30s1 of the bonding layer 30 may be coplanar to each other.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a lower conductive structure;
   an upper conductive structure disposed on the lower conductive structure;
   a first semiconductor device;
   a second semiconductor device electrically connected to the first semiconductor device by a first path in the upper conductive structure; and
   an interconnection structure,
   wherein the lower conductive structure is electrically connected to the first semiconductor device through a second path in the upper conductive structure under the first path,
   the first path comprises a plurality of first traces extending across a gap between the first semiconductor device and the second semiconductor device and electrically connecting the first semiconductor device to the second semiconductor device, wherein the outmost of the first traces define a bridge region,
   the interconnection structure is disposed under the bridge region and disposed between and electrically connecting the upper conductive structure and the lower conductive structure,
   the interconnection structure is made of a metal pillar connected to a first pad of the lower conductive structure, and wherein there is at least one void between the interconnection structure and the first pad of the lower conductive structure.

2. The semiconductor package structure of claim 1, wherein a dielectric material fills the void.

3. The semiconductor package structure of claim 1, wherein the upper conductive structure includes a second trace defining the second path, and the second path is located under the bridge region.

4. The semiconductor package structure of claim 3, wherein a projection of the second trace on the lower conductive structure exceeds an edge of a projection of the bridge region on the lower conductive structure.

5. The semiconductor package structure of claim 3, wherein the first semiconductor device is electrically connected to receive power or is grounded through the second path.

6. The semiconductor package structure of claim 1, further comprising:
   a conductive via extending through the upper conductive structure from an upper surface to a lower surface of the upper conductive structure.

7. The semiconductor package structure of claim 6, wherein the conductive via comprises a seed layer.

8. The semiconductor package structure of claim 6, wherein the first semiconductor device is electrically connected to the lower conductive structure through the conductive via.

9. The semiconductor package structure of claim 6, further comprising:
   a bonding layer disposed between the lower conductive structure and the upper conductive structure, wherein the conductive via extends through the bonding layer.

10. The semiconductor package structure of claim 9, wherein the interconnection structure is embedded in the bonding layer.

11. The semiconductor package structure of claim 1, wherein the interconnection structure comprises an interconnect element, and the interconnect element has a neck portion.

12. The semiconductor package structure of claim 9, further comprising a space defined by the upper conductive structure, the bonding layer and the interconnection structure.

13. The semiconductor package structure of claim 6, wherein the bridge region is surrounded by the conductive via.

14. The semiconductor package structure of claim 6, wherein the interconnection structure is surrounded by the conductive via.

15. The semiconductor package structure of claim 6, wherein a portion of the conductive via is disposed over the upper surface of the upper conductive structure.

16. The semiconductor package structure of claim 6, wherein a pitch of the conductive via is different from a pitch of the interconnection structure.

* * * * *